US009883585B2

(12) United States Patent
Harada

(10) Patent No.: US 9,883,585 B2
(45) Date of Patent: Jan. 30, 2018

(54) RADIO-FREQUENCY CIRCUIT MODULE

(71) Applicant: Murata Manufacturing Co., Ltd., Nagaokakyo-shi, Kyoto-fu (JP)

(72) Inventor: Tetsuro Harada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 230 days.

(21) Appl. No.: 14/731,527

(22) Filed: Jun. 5, 2015

(65) Prior Publication Data
US 2015/0271916 A1 Sep. 24, 2015

Related U.S. Application Data

(63) Continuation of application No. PCT/JP2014/069141, filed on Jul. 18, 2014.

(30) Foreign Application Priority Data

Oct. 17, 2013 (JP) .................. 2013-216559

(51) Int. Cl.
| | |
|---|---|
| *H05K 1/18* | (2006.01) |
| *H05K 1/02* | (2006.01) |
| *H03H 7/38* | (2006.01) |
| *H03H 7/01* | (2006.01) |

(Continued)

(52) U.S. Cl.
CPC ......... *H05K 1/0298* (2013.01); *H03H 7/0115* (2013.01); *H03H 7/38* (2013.01);
(Continued)

(58) Field of Classification Search
CPC ......... H03H 2001/0085; H03H 7/0115; H03H 7/38; H05K 1/0298; H05K 1/115;
(Continued)

(56) References Cited

U.S. PATENT DOCUMENTS 6,215,373 B1 * 4/2001 Novak .................. H03H 7/38
333/12
2002/0167372 A1 11/2002 Ishizaki et al.
(Continued)

FOREIGN PATENT DOCUMENTS

CN 1385963 A 12/2002
JP 2010-219941 A 9/2010
(Continued)

OTHER PUBLICATIONS

Official Communication issued in International Patent Application No. PCT/JP2014/069141, dated Oct. 14, 2014.

*Primary Examiner* — Yuriy Semenenko
(74) *Attorney, Agent, or Firm* — Keating & Bennett, LLP

(57) ABSTRACT

A radio-frequency circuit module includes a multilayer body and a surface-mount component mounted on a front surface of the multilayer body. The surface-mount component includes variable capacitance elements integrated therein. Inductors including conductor patterns are provided in the multilayer body. On a back surface of the multilayer body, a first external connection terminal and a second external connection terminal are sandwiched between ground connection terminals. Ground via-conductors connected to ground connection terminals extend to the front surface of the multilayer body. The ground via-conductors are connected to each other in a layer near the front surface by a ground connection conductor which extends in a direction perpendicular or substantially perpendicular to the extending direction.

19 Claims, 7 Drawing Sheets

(51) Int. Cl.
*H05K 1/11* (2006.01)
*H05K 1/16* (2006.01)
*H03H 1/00* (2006.01)

(52) U.S. Cl.
CPC ............ *H05K 1/115* (2013.01); *H05K 1/165* (2013.01); *H05K 1/181* (2013.01); *H03H 2001/0085* (2013.01); *H05K 2201/0195* (2013.01); *H05K 2201/10053* (2013.01); *H05K 2201/10098* (2013.01)

(58) Field of Classification Search
CPC .................. H05K 1/165; H05K 1/181; H05K 2201/0195; H05K 2201/10053; H05K 2201/10098
See application file for complete search history.

(56) References Cited

U.S. PATENT DOCUMENTS

| | | | |
|---|---|---|---|
| 2008/0266029 A1* | 10/2008 | Mi | ................ H01P 1/2013 333/205 |
| 2009/0033437 A1 | 2/2009 | Harada | |
| 2009/0206948 A1* | 8/2009 | Kemmochi | .......... H04B 1/0057 333/126 |
| 2009/0212887 A1* | 8/2009 | Rofougaran | ............ H01P 5/185 333/24 R |
| 2010/0060381 A1* | 3/2010 | Das | ........................ H05K 1/162 333/172 |
| 2010/0182097 A1* | 7/2010 | Hayashi | ............... H04B 1/0458 333/32 |
| 2010/0237964 A1 | 9/2010 | Teraguchi et al. | |
| 2012/0229231 A1* | 9/2012 | Mi | .......................... H01P 7/088 333/205 |
| 2014/0045546 A1 | 2/2014 | Onodera | |
| 2014/0106698 A1 | 4/2014 | Mi et al. | |

FOREIGN PATENT DOCUMENTS

| | | |
|---|---|---|
| JP | 2012-191521 A | 10/2012 |
| WO | 2008/004396 A1 | 1/2008 |
| WO | 2010/113746 A1 | 10/2010 |
| WO | 2012/144228 A1 | 10/2012 |
| WO | 2013/005264 A1 | 1/2013 |

* cited by examiner

RADIO-FREQUENCY CIRCUIT MODULE

BACKGROUND OF THE INVENTION

1. Field of the Invention

The present invention relates to a radio-frequency circuit module, such as a variable filter circuit module or a variable matching circuit module, which is capable of adjusting frequency characteristics or impedance characteristics for a radio-frequency signal to be transmitted.

2. Description of the Related Art

Currently, various communication devices that transmit and receive a plurality of radio-frequency signals in different frequency bands (communication bands) by using a common antenna for these radio-frequency signals are commercially available. This type of communication device includes a radio-frequency circuit module, such as a variable matching circuit or a variable filter, for performing impedance matching for each communication band. As a variable filter module, the configuration disclosed in Japanese Unexamined Patent Application Publication No. 2012-191521, for example, is available.

The variable filter device (module) disclosed in Japanese Unexamined Patent Application Publication No. 2012-191521 includes surface-mount variable capacitance elements and passive elements including distributed constant lines. In the variable filter module disclosed in Japanese Unexamined Patent Application Publication No. 2012-191521, the surface-mount variable capacitance elements are mounted on a single layer substrate, and the passive elements are formed on the surface of this substrate by using distributed constant lines, thus reducing transmission loss between the passive elements including the distributed constant lines and the variable capacitance elements.

However, the variable filter module disclosed in Japanese Unexamined Patent Application Publication No. 2012-191521 has a large size and occupies a large area since the variable capacitance elements and the passive elements including the distributed constant lines are disposed on the surface of the single layer substrate.

Additionally, line conductors used for a control signal for the variable capacitance elements and line conductors used for a radio-frequency signal for the variable capacitance elements are disposed on the same plane. Accordingly, these line conductors are likely to interfere with each other, thus increasing the possibility that a control signal mix with a radio-frequency signal to be transmitted. That is, isolation characteristics concerning the isolation of a radio-frequency signal (communication signal) from noise are likely to decrease.

SUMMARY OF THE INVENTION

Preferred embodiments of the present invention provide a small radio-frequency circuit module which is excellent in various transmission characteristics.

Preferred embodiments of the present invention relate to a radio-frequency circuit module including a passive element and a variable capacitance element and including a first input/output terminal and a second input/output terminal. The radio-frequency circuit modules according to various preferred embodiments of the present invention preferably have the following configurations.

A radio-frequency circuit module according to a preferred embodiment of the present invention includes a multilayer body including a plurality of dielectric layers stacked on each other. A passive element includes a conductor pattern disposed within the multilayer body. A variable capacitance element includes a surface-mount component mounted on a top surface of the multilayer body. A first external connection terminal defining a first input/output terminal, a second external connection terminal defining a second input/output terminal, and a plurality of ground connection terminals defining a ground of a radio-frequency circuit are located on a bottom surface of the multilayer body.

The first external connection terminal and the second external connection terminal are disposed at positions near different sides of the bottom surface of the multilayer body other than corners of the bottom surface such that they are sandwiched between the ground connection terminals in a direction along the sides. A plurality of ground connection terminals to be connected to the variable capacitance element is connected to the variable capacitance element by a plurality of ground via-conductors. The plurality of ground via-conductors extend along a stacking direction of the multilayer body for each of the plurality of ground connection terminals. The plurality of ground via-conductors are connected to each other by a ground internal connection conductor pattern on a layer near a front surface of the multilayer body.

With this configuration, the variable capacitance element and the passive element are disposed at different positions along the thickness direction of the radio-frequency circuit module, thus decreasing the area size of the radio-frequency circuit module. The first and second external connection terminals, which define and function as the input/output terminals for communication signals (radio-frequency signals), are sandwiched between ground terminals, and thus, ground terminals are reliably disposed between the first and second external connection terminals and a terminal from which a control signal for the variable capacitance element is input (control terminal). This makes it possible to secure isolation between a control transmission line and a communication signal transmission path in communication signal input/output terminals of the radio-frequency circuit. Additionally, the plurality of ground via-conductors provided within the multilayer body are connected to each other near the front surface of the multilayer body. Thus, the ground via-conductors are stabilized, and also, a planar ground is provided within the multilayer body extending in a direction perpendicular or substantially perpendicular to the front surface and the back surface of the multilayer body.

A radio-frequency circuit module according to a preferred embodiment of the present invention includes a control terminal and a control via-conductor. The control terminal is a terminal located on the bottom surface of the multilayer body and is configured to supply a control signal to the variable capacitance element. The control via-conductor is provided within the multilayer body and is configured to connect the control terminal to the variable capacitance element. As viewed in the stacking direction, a control area in which the control terminal and the control via-conductor are provided is located at a position at which it is displaced from the first external connection terminal, the second external connection terminal, the passive element, and a conductor pattern defining the radio-frequency circuit so as to be spatially isolated from these elements.

With this configuration, the communication signal transmission path and the control transmission line are spatially isolated from each other within the multilayer body, thus reliably securing high isolation between the communication signal transmission path and the control transmission line.

A radio-frequency circuit module according to a preferred embodiment of the present invention is configured such that, when the multilayer body is viewed in a direction perpendicular or substantially perpendicular to the front surface, some of the plurality of ground via-conductors are located between the control area in which the control terminal and the control via-conductor are located and a transmission area in which the first external connection terminal, the second external connection terminal, and the passive element are located.

With this configuration, the transmission area in which the communication signal transmission path is located and the control area in which the control transmission line is located are separated from each other in a radio-frequency band by a planar ground which is defined by the ground via-conductors and the ground internal connection conductor pattern in a direction perpendicular or substantially perpendicular to the front surface and the back surface of the multilayer body. This makes it possible to reliably secure high isolation between the communication signal transmission path and the control transmission line.

A radio-frequency circuit module according to a preferred embodiment of the present invention is configured such that, the first external connection terminal is connected to each of the passive element and the variable capacitance element only through a first transmission via-conductor which extends along the stacking direction of the multilayer body.

With this configuration, the first external connection terminal is connected to the passive element or the variable capacitance element with the shortest distance. This makes it possible to reliably reduce interference between the control transmission line and the transmission line which connects the first external connection terminal and the passive element or the variable capacitance element.

A radio-frequency circuit module according to a preferred embodiment of the present invention is configured such that, the second external connection terminal is connected to each of the passive element and the variable capacitance element only through a second transmission via-conductor which extends along the stacking direction of the multilayer body.

With this configuration, the second external connection terminal is connected to the passive element or the variable capacitance element with the shortest distance. This makes it possible to reliably reduce interference between the control transmission line and the transmission line which connects the second external connection terminal and the passive element or the variable capacitance element.

A radio-frequency circuit module according to a preferred embodiment of the present invention preferably includes a switch element that is included in the radio-frequency circuit and that is defined by a surface-mount component mounted on the top surface of the multilayer body, a switching terminal that is located on the bottom surface of the multilayer body and that is configured to supply a switch control signal to the switch element, and a switching via-conductor that is provided within the multilayer body and that is configured to connect the switching terminal to the switch element. As viewed in the stacking direction, a switch control area in which the switching terminal and the switching via-conductor are provided is located at a position at which the switch control area is displaced from the first external connection terminal, the second external connection terminal, the passive element, the control terminal, and the control via-conductor so as to be spatially isolate from these elements.

With this configuration, in a mode including a switch element in a radio-frequency circuit, a switch control transmission line, a communication signal transmission path, and a control transmission line are spatially isolated from each other within the multilayer body. It is thus possible to reliably secure high isolation among the switch control transmission line, the communication signal transmission path, and the control transmission line.

A radio-frequency circuit module according to a preferred embodiment of the present invention is configured such that the variable capacitance element includes a first variable capacitance element, a second variable capacitance element, and a third variable capacitance element. The passive element includes a first inductor, a second inductor, and a third inductor. The first input/output terminal and the second input/output terminal are connected to each other by a series circuit of the second inductor and the second variable capacitance element. The series circuit of the second inductor and the second variable capacitance element at a position close to the first input/output terminal is connected to ground by each of the first inductor and the first variable capacitance element. The series circuit of the second inductor and the second variable capacitance element at a position close to the second input/output terminal is connected to ground by each of the third inductor and the third variable capacitance element.

A radio-frequency circuit module according to a preferred embodiment of the present invention is configured such that the variable capacitance element includes a first variable capacitance element and a second variable capacitance element. The passive element includes a first inductor, a second inductor, a third inductor, and a fourth inductor. The switch element includes a first switch element and a second switch element. The first input/output terminal and the second input/output terminal are connected to each other by a series circuit of the third inductor, the first variable capacitance element, and the fourth inductor, and are also connected to each other by the second switch element. The series circuit of the third inductor, the first variable capacitance element, and the fourth inductor at a position close to the first input/output terminal is connected to ground by a series circuit of the second inductor and the first switch element. The series circuit of the third inductor, the first variable capacitance element, and the fourth inductor at a position close to the second input/output terminal is connected to ground by the first inductor. A node between the third inductor and the first variable capacitance element is connected to ground by the second variable capacitance element.

A radio-frequency circuit module according to a preferred embodiment of the present invention is configured such that the variable capacitance element includes a first variable capacitance element and a second variable capacitance element. The passive element includes a first inductor, a second inductor, and a third inductor. The switch element includes a first switch element and a second switch element. The first input/output terminal and the second input/output terminal are connected to each other by a series circuit of the second switch element, the first variable capacitance element, and the second inductor, and are also connected to each other by the first switch element. A node between the second switch element and the first variable capacitance element is connected to ground by each of the first inductor and the second variable capacitance element. A node between the first variable capacitance element and the second inductor is connected to ground by the third inductor.

These configurations indicate specific circuits implementing the radio-frequency circuit module. By using these circuits, it is possible to increase the impedance matching range.

According to various preferred embodiments of the present invention, a small radio-frequency circuit module which is excellent in various transmission characteristics is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A radio-frequency circuit module of a first preferred embodiment of the present invention will be described below with reference to the drawings. The radio-frequency circuit module of this preferred embodiment relates to a circuit module, such as a variable impedance matching circuit module that is capable of adjusting impedance characteristics or a variable frequency filter module that is capable of adjusting frequency characteristics.

Figure 1:
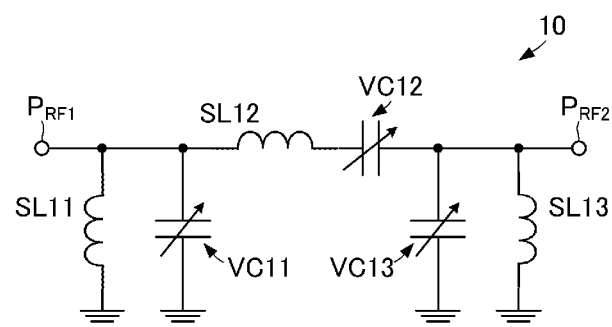
FIG. 1 is a block diagram illustrating a circuit defining a radio-frequency circuit module according to a first preferred embodiment of the present invention.

FIG. 1 is a block diagram illustrating a circuit defining the radio-frequency circuit module according to the first preferred embodiment of the present invention.

A radio-frequency circuit 10 includes a first input/output terminal $P_{RF1}$ and a second input/output terminal $P_{RF2}$. The radio-frequency circuit 10 includes inductors SL11, SL12, and SL13. The radio-frequency circuit 10 includes variable capacitance elements VC11, VC12, and VC13.

The first input/output terminal $P_{RF1}$ and the second input/output terminal $P_{RF2}$ are connected to each other by a series circuit of the inductor SL12 and the variable capacitance element VC12. A transmission line connecting the first input/output terminal $P_{RF1}$ and the inductor SL12 is connected to ground by each the inductor SL11 and the variable capacitance element VC11. In other words, the transmission line connecting the first input/output terminal $P_{RF1}$ and the inductor SL12 is connected to ground by a parallel circuit of the inductor SL11 and the variable capacitance element VC11. A transmission line connecting the second input/output terminal $P_{RF2}$ and the variable capacitance element VC12 is connected to ground by each of the inductor SL13 and the variable capacitance element VC13. In other words, the transmission line connecting the second input/output terminal $P_{RF2}$ and the variable capacitance element VC12 is connected to ground by a parallel circuit of the inductor SL13 and the variable capacitance element VC13.

In this circuit configuration, the radio-frequency circuit 10 includes the following series-connected inductor and variable capacitance element and the following sets of shunt-connected inductors and variable capacitance elements. The series-connected inductor and variable capacitance element are disposed between the first and second input/output terminals $P_{RF1}$ and $P_{RF2}$. One set of a shunt-connected inductor and a variable capacitance element is disposed at one end of the series-connected inductor and variable capacitance element at a position close to the first input/output terminal $P_{RF1}$, and the other set of a shunt-connected inductor and a variable capacitance element is disposed at the other end of the series-connected inductor and variable capacitance element at a position close to the second input/output terminal $P_{RF2}$. With this configuration, the radio-frequency circuit 10 is configured to provide an impedance matching function by the series-connected circuit device and an impedance matching function by the shunt-connected circuit device. Accordingly, it is possible to increase the range in which impedance matching is achieved.

Additionally, both of the series-connected circuit device and the shunt-connected circuit device include variable capacitance elements that are capable of varying the impedance. Thus, it is possible to achieve impedance matching with high precision in a wider range.

Figure 2:
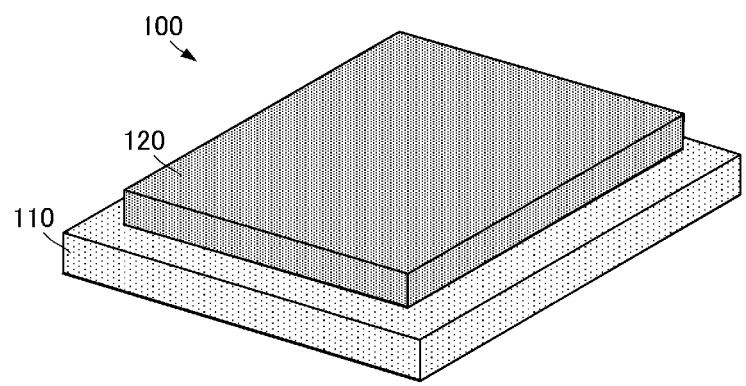
FIG. 2 is a perspective view illustrating the external appearance of the radio-frequency circuit module according to the first preferred embodiment of the present invention.
Figure 3:
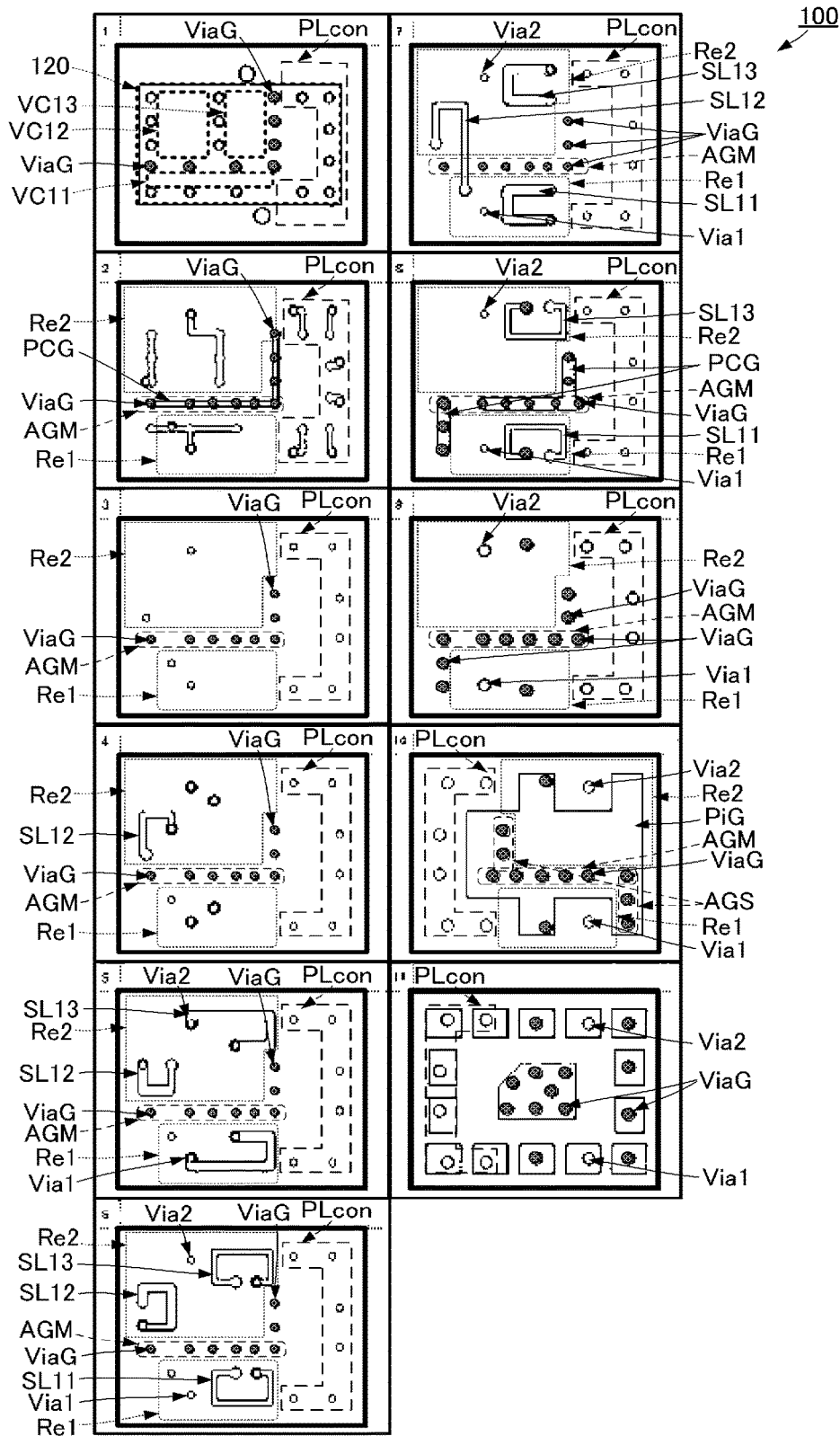
FIG. 3 is a diagram illustrating conductor patterns disposed in dielectric layers defining the radio-frequency circuit module according to the first preferred embodiment of the present invention.
Figure 4:
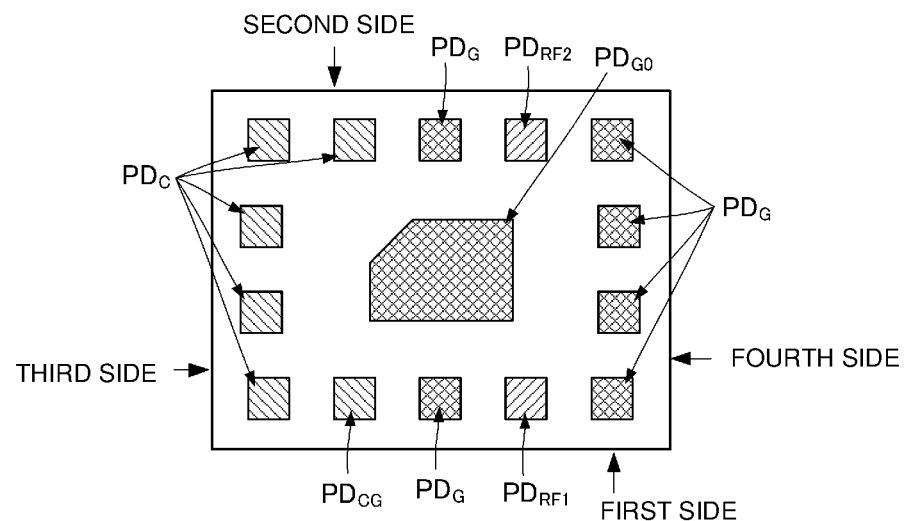
FIG. 4 is a diagram illustrating the arrangement pattern of terminals on the bottom surface of the radio-frequency circuit module according to the first preferred embodiment of the present invention.

FIG. 2 is a perspective view illustrating the external appearance of the radio-frequency circuit module according to the first preferred embodiment of the present invention. FIG. 3 is a diagram illustrating conductor patterns disposed in dielectric layers forming the radio-frequency circuit module according to the first preferred embodiment of the present invention. The circles shown in FIG. 3 indicate via-conductors extending in a direction in which the dielectric layers are stacked. In FIG. 3, layer 10 and layer 11 are mirror-reversed with respect to layer 1 through layer 9. FIG. 4 is a diagram illustrating the arrangement pattern of terminals on the bottom surface of the radio-frequency circuit module according to the first preferred embodiment of the present invention.

As shown in FIG. 2, the radio-frequency circuit 10 including the above-described circuit is implemented as a radio-frequency circuit module 100 including a multilayer body 110 and a surface-mount component 120.

The surface-mount component 120 includes variable capacitance elements VC11, VC12, and VC13 integrated therein, and is implemented by, for example, a semiconductor IC including varactor diodes or a semiconductor IC using MEMS (Micro Electro Mechanical Systems), BST ((Ba, Sr) TiO$_3$), and CMOS technologies. In the surface-mount component 120, the variable capacitance elements VC11, VC12, and VC13 are integrally configured within a single package, but they may be packaged individually.

The multilayer body 110 preferably has a rectangular or substantially rectangular parallelepiped shape and is formed preferably by stacking a plurality of dielectric layers and by sintering them. As shown in FIG. 3, the multilayer body 110 of this preferred embodiment preferably includes eleven layers, for example. On and in each dielectric layer, as shown in FIG. 3, conductor patterns and via-conductors are provided, and various terminals to be connected to an external circuit are provided on the bottom surface of the multilayer body 110. These conductor patterns, via-conductors, and terminals define portions of the radio-frequency circuit 10 shown in FIG. 1 other than the variable capacitance elements VC11, VC12, and VC13.

The multilayer body 110 and the surface-mount component 120 are preferably the same or substantially the same size, as viewed from above. That is, the external dimensions of the multilayer body 110 are determined so that the area thereof will be the same or substantially the same as that of the surface-mount component 120. This makes it possible to implement the smallest possible radio-frequency circuit module 110.

The more specific configuration of the multilayer body 110 will be discussed below with reference to FIGS. 3 and 4. A description will be given below, assuming that the topmost dielectric layer of the multilayer body 110 is layer 1, the layer number increases as the layer is located farther downward, and the bottommost dielectric layer is layer 11. For the sake of better understanding of the connection of the conductor patterns provided on the layers, the dielectric layers will be sequentially explained by starting from layer 11, that is, the bottommost layer.

On the back surface of layer 11 (back surface of the multilayer body 110), as shown in FIG. 4, terminals to be connected to an external circuit are formed and arranged. The terminals include control terminals PD$_C$ and a plurality of transmission terminals. The transmission terminals include a first external connection terminal PD$_{RF1}$, a second external connection terminal PD$_{RF2}$, a plurality of ground connection terminals PD$_G$, and a base ground connection terminal PD$_{G0}$. The control terminals PD$_C$ are terminals configured to supply a drive signal and a control signal to the variable capacitance elements VC11, VC12, and VC13, and include a plurality of control terminals PD$_C$ and a control ground terminal PD$_{CG}$.

The first external connection terminal PD$_{RF1}$, the second external connection terminal PD$_{RF2}$, the plurality of ground connection terminals PD$_G$, the plurality of control terminals PD$_C$, and the control ground terminal PD$_{CG}$ are formed and arranged along the four sides of the back surface.

The first external connection terminal PD$_{RF1}$ is disposed near the first side of the back surface at a position separate from both ends of the first side (end portions interesting with the third and fourth sides). At both sides of the first external connection terminal PD$_{RF1}$ disposed along the first side, the ground connection terminals PD$_G$ are disposed.

The second external connection terminal PD$_{RF2}$ is disposed near the second side of the back surface opposing the first side at a position separate from both ends of the second side (end portions interesting with the third and fourth sides). At both sides of the second external connection terminal PD$_{RF2}$ disposed along the second side, the ground connection terminals PD$_G$ are disposed.

The plurality of ground connection terminals PD$_G$ are disposed near and along the fourth side.

The plurality of control terminals PD$_C$ are disposed along the third or second side in a region including the third side opposing the fourth side and a predetermined range of the second side at a position close to the third side. The control ground terminal PD$_{CG}$ is disposed on the first side at a position near the third side. That is, a control area PLcon in which the plurality of control terminals PD$_C$ and the control ground terminal PD$_{CG}$ are disposed is set near the third side when the multilayer body 110 is viewed from above. The control area PLcon is an area along the first side, third side, and second side and having a predetermined width. With this arrangement, the control area PLcon is separated from a transmission area in which the transmission terminals are located.

The base ground connection terminal PD$_{G0}$ is disposed at the central region surrounded by the peripheries where the above-described terminals are disposed. The base ground connection terminal PD$_{G0}$ has a larger configuration than the above-described terminals.

With this configuration, terminals connected to ground (ground connection terminal PD$_G$ and base ground connection terminal PD$_{G0}$) are disposed between the first external connection terminal PD$_{RF1}$ and the plurality of control terminals PD$_C$ and the control ground terminal PD$_{CG}$. This makes it possible to secure high isolation between the first external connection terminal PD$_{RF1}$ and the control terminals PD$_C$, thus reducing the possibility that a control signal mix with a radio-frequency signal to be transmitted.

Terminals connected to ground (ground connection terminal PD$_G$ and base ground connection terminal PD$_{G0}$) are disposed between the second external connection terminal PD$_{RF2}$ and the plurality of control terminals PD$_C$ and the control ground terminal PD$_{CG}$. This makes it possible to secure high isolation between the second external connection terminal PD$_{RF2}$ and the control terminals PD$_C$, thus reducing the possibility that a control signal interfere with a radio-frequency signal to be transmitted.

That is, it is possible to secure high isolation between the transmission terminals and the control terminals PD$_C$.

The first external connection terminal PD$_{RF1}$ and the second external connection terminal PD$_{RF2}$ are respectively disposed near the first side and the second side opposing each other. Accordingly, there is a great distance between the first external connection terminal PD$_{RF1}$ and the second external connection terminal PD$_{RF2}$, thus making it possible to secure high isolation between the first external connection terminal PD$_{RF1}$ and the second external connection terminal PD$_{RF2}$. Additionally, the base ground connection terminal PD$_{G0}$ is disposed, although partially, between the first external connection terminal PD$_{RF1}$ and the second external connection terminal PD$_{RF2}$, thus making it possible to secure even higher isolation between the first external connection terminal PD$_{RF1}$ and the second external connection terminal PD$_{RF2}$.

In layer 11, a plurality of via-conductors are provided. The via-conductors include a first RF via-conductor Via1, a second RF via-conductor Via2, a plurality of ground via-conductors ViaG, and a plurality of control via-conductors. The first RF via-conductor Via1 and the second RF via-conductor Via2 are connected to the first external connection terminal PD$_{RF1}$ and the second external connection terminal $PD_{RF2}$, respectively. The plurality of ground via-conductors ViaG are each connected to one of the plurality of ground connection terminals $PD_G$ and base ground connection terminal $PD_{G0}$. The plurality of control via-conductors are connected to the plurality of respective control terminals $PD_C$.

On and in layer 10, an internal ground conductor PiG and a plurality of via-conductors are provided. The plurality of ground via-conductors in layer 10 are formed continuously from the plurality of via-conductors formed in layer 11 in the stacking direction.

The internal ground conductor PiG is a planar conductor pattern provided on substantially the entire surface, except for the control area PLcon, that is, it is formed on substantially the entire surface of the transmission area. The internal ground conductor PiG is connected to the plurality of ground connection terminals $PD_G$ and the base ground connection terminal $PD_{G0}$ through the use of a plurality of ground via-conductors ViaG. The internal ground conductor PiG is configured such that it is not located at positions at which a first RF via-conductor Via1 and a second RF via-conductor Via2 are located. The internal ground conductor PiG is also configured such that it is not located in regions where the first and second external connection terminals $PD_{RF1}$ and $PD_{RF2}$ in layer 11 are located, as viewed from above.

With this configuration, the first RF via-conductor Via1 is surrounded by the first side and the internal ground conductor PiG, while the second RF via-conductor Via2 is surrounded by the second side and the internal ground conductor PiG. With this arrangement, in layer 10, too, it is possible to secure high isolation between the first RF via-conductor Via1 and the second RF via-conductor Via2 and between the first and second RF via-conductors Via1 and Via2 and the control via-conductors. Moreover, since the first and second external connection terminals $PD_{RF1}$ and $PD_{RF2}$ do not oppose the internal ground conductor PiG, it is also possible to reduce radio-frequency coupling between the first external connection terminal $PD_{RF1}$ and the second external connection terminal $PD_{RF2}$ via the internal ground conductor PiG.

The control ground terminal $PD_{CG}$ and the internal ground conductor PiG are neither connected nor oppose each other. Thus, it is also possible to reduce radio-frequency coupling between the control conductor patterns and the transmission conductor patterns via the control ground terminal $PD_{CG}$ and the internal ground conductor PiG.

As shown in FIG. 3, the plurality of ground via-conductors ViaG formed in layer 10 are connected to the internal ground conductor PiG. Some of the plurality of ground via-conductors ViaG are formed along the first and second sides so as to define a main array section AGM. At the end portions of this main array section AGM at positions close to the third and fourth sides, sub array sections AGS in which the plurality of ground via-conductors ViaG are arranged along the third and fourth sides are formed. In layer 10, the plurality of ground via-conductors ViaG make it possible, not only to electromagnetically isolate the control area PLcon and the transmission area from each other, but also to electromagnetically isolate a first region Re1 including the first external connection terminal $PD_{RF1}$ and the first RF via-conductor Via1 and a second region Re2 including the second external connection terminal $PD_{RF2}$ and the second RF via-conductor Via2 from each other in the transmission area.

In layer 9, a plurality of via-conductors are formed. The plurality of via-conductors formed in layer 9 are formed continuously from those formed in layer 10 in the stacking direction. With this configuration, in layer 9, too, the control area PLcon and the transmission area are separated from each other.

In layer 8, a plurality of via-conductors are formed. The plurality of via-conductors in layer 8 are formed continuously from those formed in layer 9 in the stacking direction.

On layer 8, a loop-shaped linear conductor defining the inductor SL11 and a loop-shaped linear conductor defining the inductor SL13 are provided. The loop-shaped linear conductor defining the inductor SL11 is located in the first region Re1 of the transmission area, while the loop-shaped linear conductor defining the inductor SL13 is located in the second region Re2 of the transmission area.

With this configuration, on layer 8, too, the control area PLcon and the transmission area are separated from each other.

One end of the loop-shaped linear conductor defining the inductor SL11 and one end of the loop-shaped linear conductor defining the inductor SL13 are connected to the ground via-conductors ViaG.

On layer 8, ground connection conductors PCG are provided. The ground connection conductors PCG include a linear conductor which connects the plurality of ground via-conductors ViaG of the above-described main array section AGM and the sub array section AGS positioned near the third side and a linear conductor which connects the plurality of ground via-conductors ViaG of the sub array section AGS positioned near the fourth side. The ground connection conductors PCG stabilize the ground potential of the plurality of ground via-conductors ViaG.

The ground connection conductors PCG are disposed between the loop-shaped linear conductor defining the inductor SL11 and the loop-shaped linear conductor defining the inductor SL13. It is thus possible to reduce electromagnetic coupling between the loop-shaped linear conductor defining the inductor SL11 and the loop-shaped linear conductor defining the inductor SL13.

In layer 7, a plurality of via-conductors are formed. The plurality of via-conductors in layer 7 are formed in the stacking direction continuously from those formed in layer 8, except for the ground via-conductors ViaG connected to the loop-shaped linear conductors defining the inductors SL11 and SL13 and some of the ground via-conductors ViaG of the sub array section AGS near the fourth side in layer 8.

On layer 7, a loop-shaped linear conductor defining the inductor SL11, a loop-shaped linear conductor defining the inductor SL12, and a loop-shaped linear conductor defining the inductor SL13 are provided. The loop-shaped linear conductor defining the inductor SL11 is located in the first region Re1 of the transmission area. The loop-shaped linear conductor defining the inductor SL13 is located in the second region Re2 of the transmission area. A major portion of the loop-shaped linear conductor defining the inductor SL12 is located in the second region Re2 of the transmission area, and a portion of one end portion of the loop-shaped linear conductor is located in the first region Re1.

With this configuration, in layer 7, too, the control area PLcon and the transmission area are separated from each other.

One end of the loop-shaped linear conductor defining the inductor SL11 and one end of the loop-shaped linear conductor defining the inductor SL13 are connected to the loop-shaped linear conductor defining the inductor SL11 and the loop-shaped linear conductor defining the inductor SL13 in layer 8 through the via-conductors. The other ends of the loop-shaped linear conductors defining the inductors SL11 and SL13 are connected to loop-shaped linear conductors defining the inductors SL11 and SL13 in layer 6 through the via-conductors.

One end of the loop-shaped linear conductor defining the inductor SL12 is connected to a loop-shaped linear conductor defining the inductor SL12 in layer 6 through a via-conductor. The other end of the loop-shaped linear conductor defining the inductor SL12 is connected to the first RF via-conductor Via1 through the via-conductors of layer 6, layer 5, layer 4, layer 3, and layer 2 and a routing conductor of layer 2.

In layer 7, the main array section AGM including the plurality of ground via-conductors ViaG is disposed between the loop-shaped linear conductor defining the inductor SL11 and the loop-shaped linear conductor defining the inductor SL13. It is thus possible to reduce electromagnetic coupling between the loop-shaped linear conductor defining the inductor SL11 and the loop-shaped linear conductor defining the inductor SL13. Additionally, in layer 7, the main array section AGM including the plurality of ground via-conductors ViaG is disposed between the major portion of the loop-shaped linear conductor defining the inductor SL12 and the loop-shaped linear conductor defining the inductor SL11. It is thus possible to reduce electromagnetic coupling between the loop-shaped linear conductor defining the inductor SL11 and the loop-shaped linear conductor defining the inductor SL12.

In layer 6, a plurality of via-conductors are formed. The plurality of via-conductors in layer 6 are formed continuously from those formed in layer 7 in the stacking direction.

On layer 6, a loop-shaped linear conductor defining the inductor SL11, a loop-shaped linear conductor defining the inductor SL12, and a loop-shaped linear conductor defining the inductor SL13 are provided. The loop-shaped linear conductor defining the inductor SL11 is provided in the first region Re1 of the transmission area. The loop-shaped linear conductors defining the inductors SL12 and SL13 are provided in the second region Re2 of the transmission area.

With this configuration, in layer 6, too, the control area PLcon and the transmission area are separated from each other.

One end of the loop-shaped linear conductor defining the inductor SL11, one end of the loop-shaped linear conductor defining the inductor SL12, and one end of the loop-shaped linear conductor defining the inductor SL13 are connected to the loop-shaped linear conductors defining the inductors SL11, SL12, and SL13 in layer 7 through the via-conductors. The other ends of the loop-shaped linear conductors defining the inductors SL11, SL12, and SL13 are connected to loop-shaped linear conductors defining the inductors SL11, SL12, and SL13 in layer 5 through the via-conductors.

In layer 6, the main array section AGM including the plurality of ground via-conductors ViaG is disposed between the loop-shaped linear conductor defining the inductor SL11 and the loop-shaped linear conductors defining the inductors SL12 and SL13. It is thus possible to reduce electromagnetic coupling between the loop-shaped linear conductor defining the inductor SL11 and the loop-shaped linear conductors defining the inductors SL12 and SL13.

In layer 5, a plurality of via-conductors are formed. The plurality of via-conductors in layer 5 are formed continuously from those formed in layer 6 in the stacking direction.

On layer 5, a loop-shaped linear conductor defining the inductor SL11, a loop-shaped linear conductor defining the inductor SL12, and a loop-shaped linear conductor defining the inductor SL13 are provided. The loop-shaped linear conductor defining the inductor SL11 is located in the first region Re1 of the transmission area. The loop-shaped linear conductors defining the inductors SL12 and SL13 are located in the second region Re2 of the transmission area.

With this configuration, in layer 5, too, the control area PLcon and the transmission area are separated from each other.

One end of the loop-shaped linear conductor defining the inductor SL11, one end of the loop-shaped linear conductor defining the inductor SL12, and one end of the loop-shaped linear conductor defining the inductor SL13 are connected to the loop-shaped linear conductors defining the inductors SL11, SL12, and SL13 located on layer 6 through the via-conductors.

The other end of the loop-shaped linear conductor defining the inductor SL11 is connected to the first RF via-conductor Via1. The other end of the loop-shaped linear conductor defining the inductor SL13 is connected to the second RF via-conductor Via2. The other end of the loop-shaped linear conductor defining the inductor SL12 is connected to a loop-shaped linear conductor defining the inductor SL12 in layer 4 through a via-conductor.

In layer 5, the main array section AGM including a plurality of ground via-conductors ViaG is disposed between the loop-shaped linear conductor defining the inductor SL11 and the loop-shaped linear conductors defining the inductors SL12 and SL13. It is thus possible to reduce electromagnetic coupling between the loop-shaped linear conductor defining the inductor SL11 and the loop-shaped linear conductors defining the inductors SL12 and SL13.

In layer 4, a plurality of via-conductors are formed. The plurality of via-conductors in layer 4 are formed continuously from those formed in layer 5 in the stacking direction.

In layer 4, the main array section AGM including a plurality of ground via-conductors ViaG is disposed between the first region Re1 close to the inductor SL11 and the second region Re2 close to the inductors SL12 and SL13. It is thus possible to reduce electromagnetic coupling between the first region Re1 and the second region Re2.

On layer 4, a loop-shaped linear conductor defining the inductor SL12 is provided. The loop-shaped linear conductor defining the inductor SL12 is located in the second region Re2 of the transmission area.

With this configuration, on layer 4, too, the control area PLcon and the transmission area are separated from each other.

One end of the loop-shaped linear conductor defining the inductor SL12 is connected to the loop-shaped linear conductor defining the inductor SL12 in layer 5 through a via-conductor. One end of the loop-shaped linear conductor defining the inductor SL12 is connected to the variable capacitance element VC12 through the via-conductors in layer 3 and layer 2, the routing conductor in layer 2, and a via-conductor in layer 1.

In layer 3, a plurality of via-conductors are formed. The plurality of via-conductors in layer 3 are formed continuously from all of the plurality of via-conductors formed in layer 4 in the stacking direction, except for the via-conductor connected to one end of the inductor SL12 in layer 4.

With this configuration, on layer 3, too, the control area PLcon and the transmission area are separated from each other.

In layer 2, a plurality of via-conductors are formed. The plurality of via-conductors in layer 2 are formed continuously from those formed in layer 3 in the stacking direction.

On layer 2, a ground connection conductor PCG is provided. The ground connection conductor PCG includes a linear conductor which connects the plurality of ground via-conductors ViaG defining the main array section AGM and the sub array section AGS positioned near the third side. The ground connection conductor PCG stabilizes the ground potential of the plurality of ground via-conductors ViaG.

On layer 2, a plurality of routing conductors are provided. The transmission routing conductors for individual transmission circuit elements in the first region Re1 are located within the first region Re1. The transmission routing conductors for individual circuit elements in the second region Re2 are located within the second region Re2. The control routing conductors are located within the control area PLcon.

With this configuration, on layer 2, too, the control area PLcon and the transmission area are separated from each other.

In layer 1, a plurality of via-conductors are formed. The plurality of via-conductors in layer 1 are formed continuously from those formed in layer 2 in the stacking direction directly or via the routing conductors.

On the front surface of layer 1 (front surface of the multilayer body 110), mounting lands for mounting the surface-mount component 120 are formed. In FIG. 3, the via-conductors provided in layer 1 are shown, and the mounting lands are also located at the positions at which these via-conductors are disposed.

The mounting lands on which control terminals for the variable capacitance elements VC11, VC12, and VC13 will be mounted are connected to the control terminals $PD_C$ located on the back surface of the multilayer body 110 through the via-conductors in the above-described control area PLcon.

The mounting lands on which signal transmission terminals for the variable capacitance elements VC11, VC12, and VC13 will be mounted are connected to the inductors SL11, SL12, and SL13 within the multilayer body 110 and the transmission terminals located on the back surface of the multilayer body 110 through the via-conductors in the above-described transmission area.

Some of the mounting lands on which the signal transmission terminals for the variable capacitance elements VC11, VC12, and VC13 will be mounted are connected to the above-described ground via-conductors ViaG. Mounting lands connected to ground via-conductors ViaG are disposed between a portion forming the variable capacitance element VC11 of the surface-mount component 120 and portions defining the variable capacitance elements VC12 and VC13. Other mounting lands connected to ground via-conductors ViaG are disposed between the portions defining the variable capacitance elements VC12 and VC13 of the surface-mount component 120 and a portion into which a control signal is input.

With this configuration, it is possible to divide the multilayer body 110 into the transmission area and the control area PLcon in a radio-frequency band, thus making it possible to reduce electromagnetic coupling between these areas.

The transmission area of the multilayer body 110 is able to be further divided into the first region Re1 close to the first input/output terminal $P_{RF1}$ (first external connection terminal $PD_{RF1}$) and the second region Re2 close to the second input/output terminal $P_{RF2}$ (second external connection terminal $PD_{RF2}$), thus making it possible to reduce electromagnetic coupling between the first input/output terminal $P_{RF1}$ and the second input/output terminal $P_{RF2}$.

It is thus possible to implement a small radio-frequency circuit module which is excellent in variable impedance characteristics, variable frequency characteristics, and transmission characteristics.

In the configuration of this preferred embodiment, when the multilayer body 110 is viewed from above, the loop-shaped linear conductor defining the inductor SL11 connected between the first input/output terminal $P_{RF1}$ (first external connection terminal $PD_{RF1}$) and ground is located within the first region Re1 near the first external connection terminal $PD_{RF1}$, while the loop-shaped linear conductor defining the inductor SL13 connected between the second input/output terminal $P_{RF2}$ (second external connection terminal $PD_{RF2}$) and ground is located within the second region Re2 near the second external connection terminal $PD_{RF2}$. With this configuration, it is possible to reduce electromagnetic coupling between the inductors SL11 and SL13.

In the configuration of this preferred embodiment, the first input/output terminal $P_{RF1}$ (first external connection terminal $PD_{RF1}$) and the inductor SL11 are connected to each other only through the use of via-conductors. The second input/output terminal $P_{RF2}$ (second external connection terminal $PD_{RF2}$) and the inductor SL13 are connected to each other only through the use of via-conductors. This makes it possible to reduce electromagnetic coupling with other circuit elements or transmission lines. It is thus possible to implement a small radio-frequency circuit module which is even more excellent in variable impedance characteristics and transmission characteristics.

In the configuration of this preferred embodiment, the plurality of ground via-conductors ViaG connected to the internal ground conductor PiG disposed near the bottommost layer of the multilayer body 110 and extending in the stacking direction are connected to each other in a direction perpendicular or substantially perpendicular to the extending direction by the ground connection conductor PCG within the layer (layer 2) near the front surface of the multilayer body 110. With this arrangement, the ground within the multilayer body 110 is stabilized and strengthened, and also, the ground near the mounting position of the surface-mount component (near the front surface of the multilayer body 110) is stabilized and strengthened. Additionally, a planar ground parallel or substantially parallel with the stacking direction is provided. By the formation of this planar ground, the control area PLcon and the transmission area is spatially isolated from each other, and the first region Re1 and the second region Re2 of the transmission area is spatially isolated from each other. It is thus possible to implement a small radio-frequency circuit module which is excellent in transmission characteristics.

In the configuration of this preferred embodiment, the mounting lands to be connected to the ground of the surface-mount component 120 are directly connected, only through the use of the ground via-conductors ViaG, to the internal ground conductor PiG disposed near the bottommost layer of the multilayer body 110 and to the ground connection terminals $PD_G$ and the base ground connection terminal $PD_{G0}$ on the back surface of the multilayer body 110. With this arrangement, the lengths of transmission lines that connect the surface-mount component 120 to ground can be decreased. Accordingly, it is possible to prevent electromagnetic coupling with other transmission lines and circuit elements and also to stabilize the ground. Thus, variable impedance characteristics with even higher precision are achieved.

Figure 5:
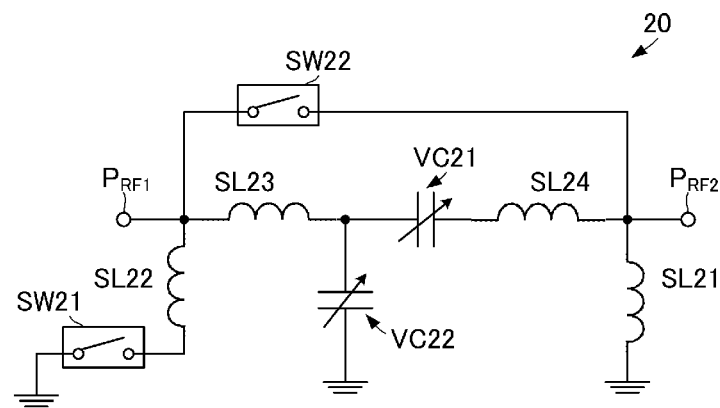
FIG. 5 is a block diagram illustrating a circuit defining a radio-frequency circuit module according to a second preferred embodiment of the present invention.

A radio-frequency circuit module according to a second preferred embodiment of the present invention will be described below with reference to the drawings. FIG. 5 is a block diagram illustrating a circuit defining the radio-frequency circuit module according to the second preferred embodiment of the present invention.

A radio-frequency circuit 20 includes a first input/output terminal $P_{RF1}$ and a second input/output terminal $P_{RF2}$. The radio-frequency circuit 20 includes inductors SL21, SL22, SL23, and SL24. The radio-frequency circuit 20 includes variable capacitance elements VC21 and VC22. The radio-frequency circuit 20 includes switch elements SW21 and SW22.

The first input/output terminal $P_{RF1}$ and the second input/output terminal $P_{RF2}$ are connected to each other by a series circuit of the inductor SL23, the variable capacitance element VC21, and the inductor SL24. The first input/output terminal $P_{RF1}$ and the second input/output terminal $P_{RF2}$ are also connected to each other by the switch element SW22. That is, the switch element SW22 and the series circuit of the inductor SL23, the variable capacitance element VC21, and the inductor SL24 are connected in parallel with each other between the first input/output terminal $P_{RF1}$ and the second input/output terminal $P_{RF2}$.

Transmission lines which connect the first input/output terminal $P_{RF2}$ to the inductor SL23 and the switch element SW22 are connected to ground by a series circuit of the inductor SL22 and the switch element SW21.

Transmission lines which connect the second input/output terminal $P_{RF2}$ to the inductor SL24 and the switch element SW22 are connected to ground by the inductor SL21.

A transmission line which connects the inductor SL23 and the variable capacitance element VC21 is connected to ground by the variable capacitance element VC22.

With the above-described circuit configuration, the radio-frequency circuit 20, as well as the radio-frequency circuit 10 of the first preferred embodiment, achieves impedance matching with high precision in a wide range. The radio-frequency circuit 20 also performs ON/OFF control of the switch elements SW21 and SW22 so as to make further modifications to the circuit. This achieves impedance matching in a wider range.

Figure 6:
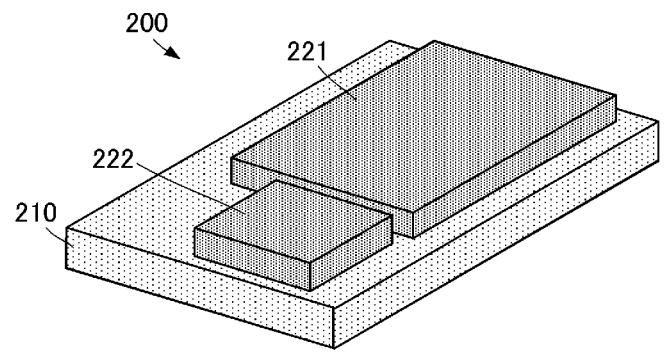
FIG. 6 is a perspective view illustrating the external appearance of the radio-frequency circuit module according to the second preferred embodiment of the present invention.
Figure 7:
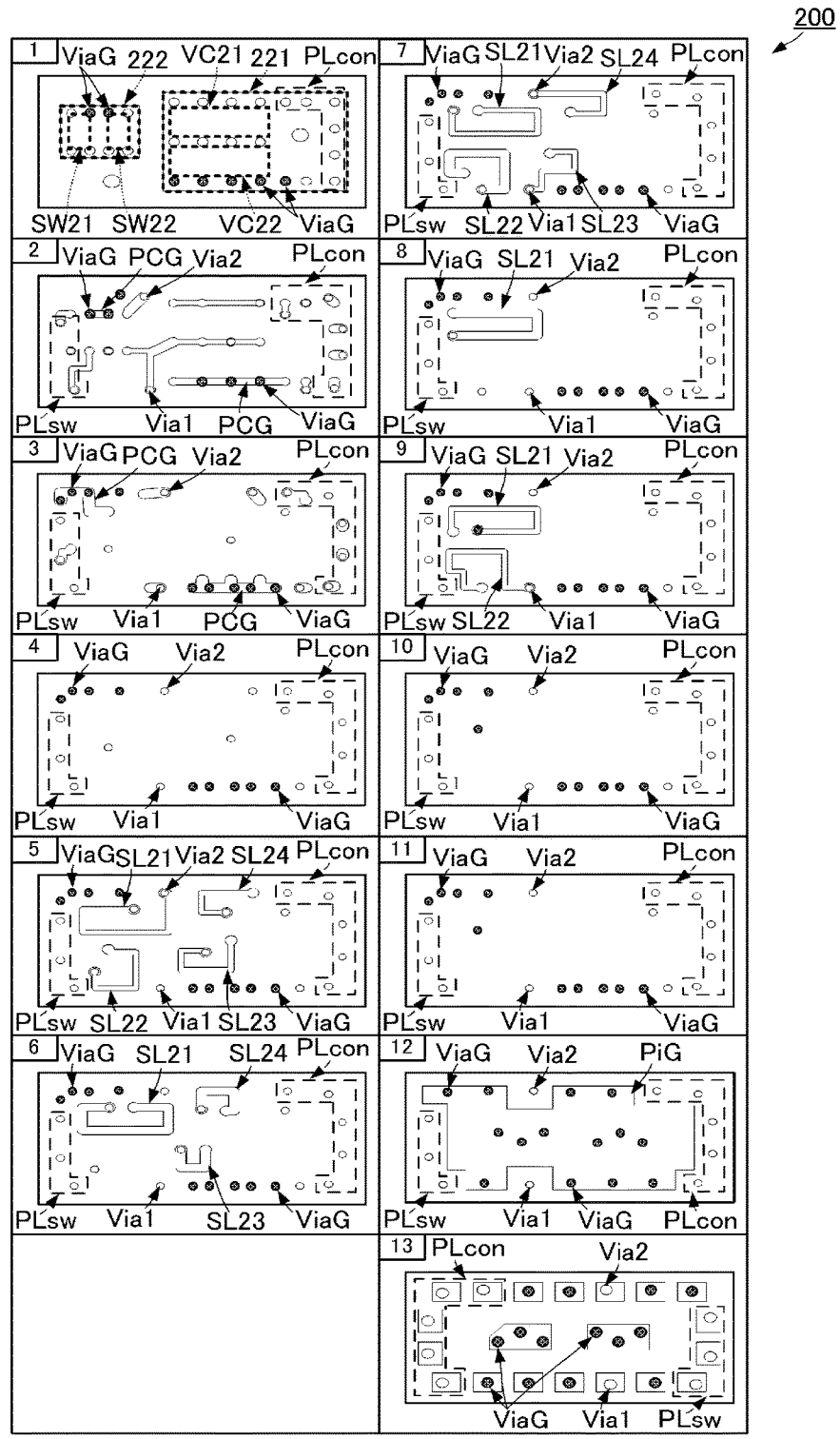
FIG. 7 is a diagram illustrating conductor patterns disposed in dielectric layers defining the radio-frequency circuit module according to the second preferred embodiment of the present invention.
Figure 8:
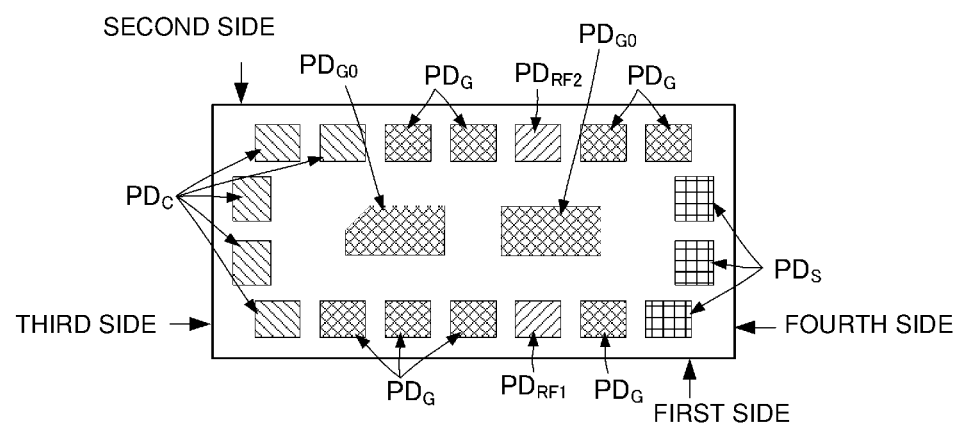
FIG. 8 is a diagram illustrating the arrangement pattern of terminals on the bottom surface of the radio-frequency circuit module according to the second preferred embodiment of the present invention.

FIG. 6 is a perspective view illustrating the external appearance of the radio-frequency circuit module according to the second preferred embodiment of the present invention. FIG. 7 is a diagram illustrating conductor patterns disposed in dielectric layers defining the radio-frequency circuit module according to the second preferred embodiment of the present invention. The circles shown in FIG. 7 indicate via-conductors extending in a direction in which the dielectric layers are stacked. In FIG. 7, layer 13 is mirror-reversed with respect to layer 1 through layer 12. FIG. 8 is a diagram illustrating the arrangement pattern of terminals on the bottom surface of the radio-frequency circuit module according to the second preferred embodiment of the present invention.

As shown in FIG. 6, the radio-frequency circuit 20 including the above-described circuit is implemented as a radio-frequency circuit module 200 including a multilayer body 210 and surface-mount components 221 and 222.

The surface-mount component 221 has the variable capacitance elements VC21 and VC22 integrated therein, and is implemented by, for example, a semiconductor IC including varactor diodes or a semiconductor IC using MEMS (Micro Electro Mechanical Systems), BST ((Ba, Sr) $TiO_3$), and CMOS technologies. In the surface-mount component 221, the variable capacitance elements VC21 and VC22 preferably are integrally configured within a single package, but they may be packaged individually.

The surface-mount component 222 has the switch elements SW21 and SW22 integrated therein, and is implemented by, for example, semiconductor switches. In the surface-mount component 222, the switch elements SW21 and SW22 preferably are integrally configured within a single package, but they may be packaged individually.

The multilayer body 210 preferably has a rectangular or substantially rectangular parallelepiped shape and is formed preferably by stacking a plurality of dielectric layers and by sintering them. As shown in FIG. 7, the multilayer body 210 of this preferred embodiment preferably includes thirteen layers, for example. On and in each dielectric layer, as shown in FIG. 7, conductor patterns and via-conductors are formed, and various terminals to be connected to an external circuit are provided on the bottom surface of the multilayer body 210. These conductor patterns, via-conductors, and terminals define portions of the radio-frequency circuit 20 shown in FIG. 5 other than the variable capacitance elements VC21 and VC22 and the switch elements SW21 and SW22.

The mounting region of the surface-mount components 221 and 222 are preferably the same size or substantially the same size as that of the multilayer body 210, as viewed from above. This makes it possible to implement the smallest possible radio-frequency circuit module 200.

The more specific configuration of the multilayer body 210 will be discussed below with reference to FIGS. 7 and 8. A description will be given below, assuming that the topmost dielectric layer of the multilayer body 210 is layer 1, the layer number increases as the layer is located farther downward, and the bottommost dielectric layer is layer 13. For the sake of better understanding of the connection of the conductor patterns formed in the layers, the dielectric layers will be sequentially explained by starting from layer 13, that is, the bottommost layer.

On the back surface of layer 13 (back surface of the multilayer body 210), as shown in FIG. 8, terminals to be connected to an external circuit are formed and arranged. The terminals include control terminals $PD_C$, a plurality of transmission terminals, and switching terminals $PD_S$. The transmission terminals include a first external connection terminal $PD_{RF1}$, a second external connection terminal $PD_{RF2}$, a plurality of ground connection terminals $PD_G$, and base ground connection terminals $PD_{G0}$. The control terminals $PD_C$ are terminals configured to supply a drive signal and a control signal to the variable capacitance elements VC21 and VC22. The switching terminals $PD_S$ are terminals configured to supply a drive signal and a control signal to the switch elements SW21 and SW22.

The first external connection terminal $PD_{RF1}$, the second external connection terminal $PD_{RF2}$, the plurality of ground connection terminals $PD_G$, the plurality of control terminals $PD_C$, and the plurality of switching terminals $PD_S$ are formed and arranged along the four sides of the back surface.

The first external connection terminal $PD_{RF1}$ is disposed near the first side of the back surface at a position separate from both ends of the first side (end portions interesting with the third and fourth sides). At both sides of the first external connection terminal $PD_{RF1}$ disposed along the first side, the ground connection terminals $PD_G$ are disposed.

The second external connection terminal $PD_{RF2}$ is disposed near the second side of the back surface opposing the first side at a position separate from both ends of the second side (end portions interesting with the third and fourth sides). At both sides of the second external connection terminal $PD_{RF2}$ disposed along the second side, the ground connection terminals $PD_G$ are disposed.

The plurality of control terminals $PD_C$ are disposed along the third or second side in a region including the third side and a predetermined range of the second side at a position close to the third side. That is, a control area PLcon in which the plurality of control terminals $PD_C$ are disposed is set near the third side when the multilayer body 110 is viewed from above. The control area PLcon is an area along the third side and the second side and having a predetermined width. With this arrangement, the control area PLcon is separated from a transmission area in which the transmission terminals are located.

The plurality of switching terminals $PD_S$ are disposed near and along the fourth side opposing the third side. That is, a switch control area PLsw in which the plurality of switching terminals $PD_S$ are disposed is set near the fourth side when the multilayer body 110 is viewed from above. The control switch area PLsw is an area along the fourth side and having a predetermined width. With this arrangement, the switch control area PLsw is separated from the control area PLcon and the transmission area in which the transmission terminals are located.

The base ground connection terminals $PD_{G0}$ are disposed at the central region surrounded by the peripheries where the above-described terminals are disposed. The base ground connection terminals $PD_{G0}$ preferably have a larger configuration than the above-described terminals.

With this configuration, terminals connected to ground (ground connection terminals $PD_G$ and base ground connection terminals $PD_{G0}$) are disposed between the first external connection terminal $PD_{RF1}$ and the plurality of control terminals $PD_C$. This makes it possible to secure high isolation between the first external connection terminal $PD_{RF1}$ and the control terminals $PD_C$, thus reducing the possibility that a control signal mix with a radio-frequency signal to be transmitted.

Terminals connected to ground (ground connection terminals $PD_G$ and base ground connection terminals $PD_{G0}$) are disposed between the second external connection terminal $PD_{RF2}$ and the plurality of control terminals $PD_C$. This makes it possible to secure high isolation between the second external connection terminal $PD_{RF2}$ and the control terminals $PD_C$, thus reducing the possibility that a control signal interfere with a radio-frequency signal to be transmitted.

That is, it is possible to secure high isolation between the transmission terminals and the control terminals $PD_C$.

In this configuration, terminals connected to ground (ground connection terminal $PD_G$ and base ground connection terminal $PD_{G0}$) are disposed between the first external connection terminal $PD_{RF1}$ and the plurality of switching terminals $PD_S$. This makes it possible to secure high isolation between the first external connection terminal $PD_{RF1}$ and the switching terminals $PD_S$, thus reducing the possibility that a control signal mix with a radio-frequency signal to be transmitted.

Terminals connected to ground (ground connection terminals $PD_G$ and base ground connection terminal $PD_{G0}$) are disposed between the second external connection terminal $PD_{RF2}$ and the plurality of switching terminals $PD_S$. This makes it possible to secure high isolation between the second external connection terminal $PD_{RF2}$ and the switching terminals $PD_S$, thus reducing the possibility that a control signal interfere with a radio-frequency signal to be transmitted.

That is, it is possible to secure high isolation between the transmission terminals and the switching terminals $PD_S$.

The first external connection terminal $PD_{RF1}$ and the second external connection terminal $PD_{RF2}$ are respectively disposed near the first side and the second side opposing each other. Accordingly, there is a great distance between the first external connection terminal $PD_{RF1}$ and the second external connection terminal $PD_{RF2}$, thus making it possible to secure high isolation between the first external connection terminal $PD_{RF1}$ and the second external connection terminal $PD_{RF2}$. Additionally, the base ground connection terminals $PD_{G0}$ are disposed between the first external connection terminal $PD_{RF1}$ and the second external connection terminal $PD_{RF2}$, thus making it possible to secure even higher isolation between the first external connection terminal $PD_{RF1}$ and the second external connection terminal $PD_{RF2}$.

In layer 13, a plurality of via-conductors are formed. The via-conductors include a first RF via-conductor Via1, a second RF via-conductor Via2, a plurality of ground via-conductors ViaG, a plurality of control via-conductors, and a plurality of switching via-conductors. The first RF via-conductor Via1 and the second RF via-conductor Via2 are connected to the first external connection terminal $PD_{RF1}$ and the second external connection terminal $PD_{RF2}$, respectively. The plurality of ground via-conductors ViaG are each connected to one of the plurality of ground connection terminals $PD_G$ and base ground connection terminals $PD_{G0}$. The plurality of control via-conductors are connected to the plurality of respective control terminals $PD_C$. The plurality of switching via-conductors are connected to the plurality of respective switching terminals $PD_S$.

On and in layer 12, an internal ground conductor PiG and a plurality of via-conductors are formed. The plurality of via-conductors in layer 12 are formed continuously from those formed in layer 13 in the stacking direction.

The internal ground conductor PiG is a planar conductor pattern provided on substantially the entire surface, except for the control area PLcon and the switch control area PLsw, that is, it is provided on substantially the entire surface of the transmission area. The internal ground conductor PiG is connected to the plurality of ground connection terminals $PD_G$ and the base ground connection terminals $PD_{G0}$ through the use of a plurality of ground via-conductors ViaG. The internal ground conductor PiG is configured such that it is not located at positions at which a first RF via-conductor Via1 and a second RF via-conductor Via2 are formed. The internal ground conductor PiG is also configured such that it is not located in regions where the first and second external connection terminals $PD_{RF1}$ and $PD_{RF2}$ in layer 13 are located, as viewed from above.

With this configuration, the first RF via-conductor Via1 is surrounded by the first side and the internal ground conductor PiG, while the second RF via-conductor Via2 is surrounded by the second side and the internal ground conductor PiG. With this arrangement, in layer 12, too, it is possible to secure high isolation between the first RF via-conductor Via1 and the second RF via-conductor Via2 and between the first and second RF via-conductors Via1 and Via2 and the control via-conductors. Moreover, since the first and second external connection terminals $PD_{RF1}$ and $PD_{RF2}$ do not oppose the internal ground conductor PiG, it is also possible to reduce radio-frequency coupling between the first external connection terminal $PD_{RF1}$ and the second external connection terminal $PD_{RF2}$ via the internal ground conductor PiG.

With this configuration, in layer 12, too, the control area PLcon, the transmission area, and the switch control area PLsw are separated from each other.

In layer 11, a plurality of via-conductors are formed. The plurality of control via-conductors and switching via-conductors in layer 11 are formed continuously from those formed in layer 12 in the stacking direction. First and second RF via-conductors Via1 and Via2 in layer 11 are formed continuously from those formed in layer 12 in the stacking direction.

When the multilayer body 210 is viewed from above, a plurality of ground via-conductors ViaG in layer 11 are formed within a region where the internal ground conductor PiG in layer 12 is formed, and are connected to the internal ground conductor PiG in layer 12. Some of the plurality of ground via-conductors ViaG are formed near and along the first side, and are disposed between the first RF via-conductor Via1 and the control via-conductors. Since these ground via-conductors ViaG are located within the region in which the internal ground conductor PiG is located, they are located within the transmission area.

With this configuration, in layer 11, too, the control area PLcon, the transmission area, and the switch control area PLsw are separated from each other.

In layer 10, a plurality of via-conductors are formed. The plurality of via-conductors in layer 10 are formed continuously from those formed in layer 11 in the stacking direction.

With this configuration, in layer 10, too, the control area PLcon, the transmission area, and the switch control area PLsw are separated from each other.

In layer 9, a plurality of via-conductors are formed. The plurality of via-conductors in layer 9 are formed continuously from those formed in layer 10 in the stacking direction.

On layer 9, a loop-shaped linear conductor defining the inductor SL21 and a loop-shaped linear conductor defining the inductor SL22 are provided. The loop-shaped linear conductors defining the inductors SL21 and SL22 are located within the transmission area.

With this configuration, in layer 9, too, the control area PLcon, the transmission area, and the switch control area PLsw are separated from each other.

One end of the loop-shaped linear conductor defining the inductor SL21 is connected to the ground via-conductor ViaG. One end of the loop-shaped linear conductor defining the inductor SL22 is connected to the first RF via-conductor Via1.

In layer 8, a plurality of via-conductors are formed. The plurality of via-conductors in layer 8 are formed continuously from those formed in layer 9 in the stacking direction, except for the ground via-conductor ViaG connected to the loop-shaped linear conductor defining the inductor SL22 in layer 9.

On layer 8, a loop-shaped linear conductor defining the inductor SL21 is provided. The loop-shaped linear conductor defining the inductor SL21 is located within the transmission area.

With this configuration, in layer 8, too, the control area PLcon, the transmission area, and the switch control area PLsw are separated from each other.

One end of the loop-shaped linear conductor defining the inductor SL21 is connected to the loop-shaped linear conductor defining the inductor SL21 in layer 9 through a via-conductor.

In layer 7, a plurality of via-conductors are formed. The plurality of via-conductors in layer 7 are formed continuously from those formed in layer 8 in the stacking direction, except for the via-conductor connected to one end of the loop-shaped linear conductor defining the inductor SL21 in layer 8.

On layer 7, loop-shaped linear conductors defining the inductors SL21, SL22, SL23, and SL24 are provided. The loop-shaped linear conductors defining the inductors SL21, SL22, SL23, and SL24 are located within the transmission area.

With this configuration, in layer 7, too, the control area PLcon, the transmission area, and the switch control area PLsw are separated from each other.

One end of the loop-shaped linear conductor defining the inductor SL21 is connected to the loop-shaped linear conductor defining the inductor SL21 in layer 8 through a via-conductor. One end of the loop-shaped linear conductor defining the inductor SL22 is connected to the loop-shaped linear conductor defining the inductor SL22 in layer 9 through a via-conductor. One end of the loop-shaped linear conductor defining the inductor SL23 is connected to the first RF via-conductor Via1. One end of the loop-shaped linear conductor defining the inductor SL24 is connected to the second RF via-conductor Via2.

In layer 6, a plurality of via-conductors are formed. The plurality of via-conductors in layer 6 are formed continuously from those formed in layer 7 in the stacking direction, except for the via-conductor connected to one end of the loop-shaped linear conductor defining the inductor SL21 and the via-conductor connected to one end of the loop-shaped linear conductor defining the inductor SL22 in layer 7.

On layer 6, loop-shaped linear conductors defining the inductors SL21, SL23, and SL24 are provided. The loop-shaped linear conductors defining the inductors SL21, SL23, and SL24 are located within the transmission area.

With this configuration, in layer 6, too, the control area PLcon, the transmission area, and the switch control area PLsw are separated from each other.

One end of the loop-shaped linear conductor defining the inductor SL21 is connected to the loop-shaped linear conductor defining the inductor SL21 in layer 7 through a via-conductor. One end of the loop-shaped linear conductor defining the inductor SL23 is connected to the loop-shaped linear conductor defining the inductor SL23 in layer 7 through a via-conductor. One end of the loop-shaped linear conductor defining the inductor SL24 is connected to the loop-shaped linear conductor defining the inductor SL24 in layer 7 through a via-conductor.

In layer 5, a plurality of via-conductors are formed. The plurality of via-conductors in layer 5 are formed continuously from those formed in layer 6 in the stacking direction, except for the via-conductor connected to one end of the loop-shaped linear conductor defining the inductor SL21, the via-conductor connected to one end of the loop-shaped linear conductor defining the inductor SL23, and the via-conductor connected to one end of the loop-shaped linear conductor defining the inductor SL24 in layer 6.

On layer 5, loop-shaped linear conductors defining the inductors SL21, SL22, SL23, and SL24 are provided. The loop-shaped linear conductors defining the inductors SL21, SL22, SL23, and SL24 are located within the transmission area.

With this configuration, in layer 5, too, the control area PLcon, the transmission area, and the switch control area PLsw are separated from each other.

One end of the loop-shaped linear conductor defining the inductor SL21 is connected to the loop-shaped linear conductor defining the inductor SL21 in layer 6 through a via-conductor. One end of the loop-shaped linear conductor defining the inductor SL22 is connected to the loop-shaped linear conductor defining the inductor SL22 in layer 7 through a via-conductor. One end of the loop-shaped linear conductor defining the inductor SL23 is connected to the loop-shaped linear conductor defining the inductor SL23 in layer 6. One end of the loop-shaped linear conductor defining the inductor SL24 is connected to the loop-shaped linear conductor defining the inductor SL24 in layer 6.

The other end of the loop-shaped linear conductor defining the inductor SL21 is connected to the second RF via-conductor Via2. The other end of the loop-shaped linear conductor defining the inductor SL22 is connected to the switch element SW21 of the surface-mount component 222 through the via-conductors of layer 4, layer 3, layer 2, and layer 1. The other end of the loop-shaped linear conductor defining the inductor SL23 is connected to the variable capacitance elements VC21 and VC22 of the surface-mount component 221 through the via-conductors of layer 4, layer 3, layer 2, and layer 1 and a routing conductor of layer 2. The other end of the loop-shaped linear conductor defining the inductor SL24 is connected to the variable capacitance element VC21 of the surface-mount component 221 through the via-conductors of layer 4, layer 3, layer 2, and layer 1 and a routing conductor of layer 2.

In layer 4, a plurality of via-conductors are formed. The plurality of via-conductors in layer 4 are formed continuously from those formed in layer 5 in the stacking direction, except for the via-conductor connected to one end of the loop-shaped linear conductor defining the inductor SL21, the via-conductor connected to one end of the loop-shaped linear conductor defining the inductor SL22, the via-conductor connected to one end of the loop-shaped linear conductor defining the inductor SL23, and the via-conductor connected to one end of the loop-shaped linear conductor defining the inductor SL24 in layer 5.

With this configuration, in layer 4, too, the control area PLcon, the transmission area, and the switch control area PLsw are separated from each other.

In layer 3, a plurality of via-conductors are formed. The plurality of via-conductors in layer 3 are formed continuously from those formed in layer 4 in the stacking direction.

On layer 3, a plurality of ground connection conductors PCG are provided. Each of the ground connection conductors PCG includes a linear conductor which connects a plurality of ground via-conductors ViaG adjacent to the corresponding ground connection conductor PCG. The ground connection conductors PCG stabilize the ground potential of the plurality of ground via-conductors ViaG. The plurality of ground connection conductors PCG are located within the transmission area.

On layer 3, routing conductors configured to finely adjust the positions of the first and second RF via-conductors Via1 and Via2 are provided. These routing conductors are located within the transmission area.

With this configuration, in layer 3, too, the control area PLcon, the transmission area, and the switch control area PLsw are separated from each other.

In layer 2, a plurality of via-conductors are formed. The plurality of via-conductors in layer 2 are formed continuously from those formed in layer 3 in the stacking direction, except for the ground via-conductors ViaG in layer 3. In layer 2, a plurality of ground via-conductors ViaG are formed at positions at which they are superposed on the ground connection conductors PCG in layer 3.

On layer 2, a plurality of ground connection conductors PCG are provided. Each of the ground connection conductors PCG includes a linear conductor which connects a plurality of ground via-conductors ViaG adjacent to the corresponding ground connection conductor PCG. The ground connection conductors PCG stabilize the ground potential of the plurality of ground via-conductors ViaG. The plurality of ground connection conductors PCG are located within the transmission area.

On layer 2, various routing conductors are provided. These routing conductors are located within the transmission area.

With this configuration, in layer 2, too, the control area PLcon, the transmission area, and the switch control area PLsw are separated from each other.

In layer 1, a plurality of via-conductors are formed. The plurality of via-conductors in layer 1 are formed continuously in the stacking direction from the via-conductors and the RF via-conductors Via1 and Via2 formed in layer 2, except for the ground via-conductors ViaG, directly or via the routing conductors. In layer 1, a plurality of ground via-conductors ViaG are formed at positions at which they are superposed on the ground connection conductors PCG in layer 2.

On the front surface of layer 1 (front surface of the multilayer body 210), mounting lands configured to mount the surface-mount components 221 and 222 are formed. In FIG. 7, the via-conductors formed in layer 1 are shown, and the mounting lands are also located at the positions at which these via-conductors are disposed.

The mounting lands on which control terminals for the variable capacitance elements VC21 and VC22 of the surface-mount component 221 will be mounted are connected to the control terminals $PD_C$ on the back surface of the multilayer body 210 through the via-conductors in the above-described control area PLcon.

The mounting lands on which control terminals for the switch elements SW21 and SW22 of the surface-mount component 222 will be mounted are connected to the switching terminals $PD_S$ on the back surface of the multilayer body 210 through the via-conductors in the above-described switch control area PLsw.

Some of the mounting lands on which signal transmission terminals for the variable capacitance elements VC21 and VC22 and the switch elements SW21 and SW22 will be mounted are connected to the above-described ground via-conductors ViaG. As stated above, in the configuration of this preferred embodiment, the plurality of ground via-conductors ViaG connected to the internal ground conductor PiG disposed near the bottommost layer of the multilayer body 210 and extending in the stacking direction are connected to each other in a direction perpendicular or substantially perpendicular to the extending direction by the ground connection conductors PCG within the layers (layer 2 and layer 3) near the front surface of the multilayer body 210. With this arrangement, the ground within the multilayer body 210 is stabilized and strengthened, and also, the ground near the mounting positions of the surface-mount components (near the front surface of the multilayer body 210) is stabilized and strengthened. Additionally, a planar ground electrode parallel or substantially parallel with the stacking direction is preferably provided. In the configuration of this preferred embodiment, this planar ground conductor is disposed near the side surface of the multilayer body 210, thus reducing electromagnetic coupling between the circuit within the multilayer body 210 and an external source. It is thus possible to implement a small radio-frequency circuit module which is even more excellent in transmission characteristics.

In the configuration of this preferred embodiment, the mounting lands to be connected to the ground of the surface-mount components 221 and 222 are connected, only through the use of the ground via-conductors ViaG and the short ground connection conductors PCG formed at positions at which the ground via-conductors ViaG are concentrated, to the internal ground conductor PiG disposed near the bottommost layer of the multilayer body 210 and to the ground connection terminals $PD_G$ and the base ground connection terminals $PD_{G0}$ on the back surface of the multilayer body 210. With this arrangement, the lengths of transmission lines that connect the surface-mount components 221 and 222 to the ground are decreased. Accordingly, it is possible to prevent electromagnetic coupling with other transmission lines and circuit elements and also to stabilize the ground. Thus, variable impedance characteristics with even higher precision are achieved.

In the configuration of this preferred embodiment, the first input/output terminal $P_{RF1}$ (first external connection terminal $PD_{RF1}$) and the inductors SL22 and SL23 are connected to each other only through the use of via-conductors. The second input/output terminal $P_{RF2}$ (second external connection terminal $PD_{RF2}$) and the inductors SL21 and SL24 are connected to each other only through the use of via-conductors. This makes it possible to reduce electromagnetic coupling with other circuit elements or transmission lines. It is thus possible to implement a small radio-frequency circuit module which is even more excellent in variable impedance characteristics and transmission characteristics.

Figure 9:
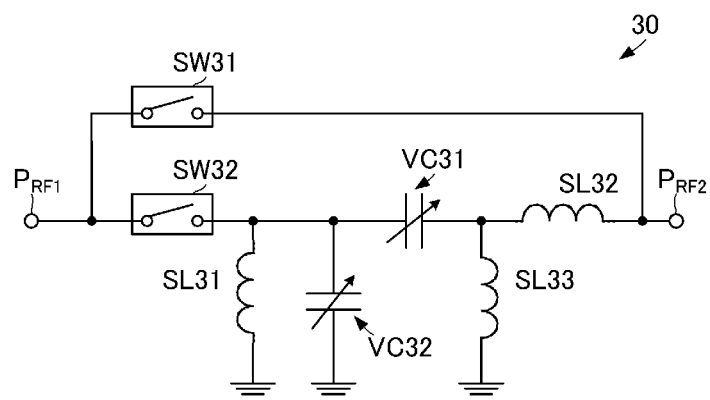
FIG. 9 is a block diagram illustrating a circuit defining a radio-frequency circuit module according to a third preferred embodiment of the present invention.

A radio-frequency circuit module according to a third preferred embodiment of the present invention will be described below with reference to the drawings. FIG. 9 is a block diagram illustrating a circuit forming the radio-frequency circuit module according to the third preferred embodiment of the present invention.

A radio-frequency circuit 30 includes a first input/output terminal $P_{RF1}$ and a second input/output terminal $P_{RF2}$. The radio-frequency circuit 30 includes inductors SL31, SL32, and SL33. The radio-frequency circuit 30 includes variable capacitance elements VC31 and VC32. The radio-frequency circuit 30 includes switch elements SW31 and SW32.

The first input/output terminal $P_{RF1}$ and the second input/output terminal $P_{RF2}$ are connected to each other by a series circuit of the switch circuit SW31, the variable capacitance element VC31, and the inductor SL32. The first input/output terminal $P_{RF1}$ and the second input/output terminal $P_{RF2}$ are also connected to each other by the switch element SW31. That is, the switch element SW31 and the series circuit of the switch element SW31, the variable capacitance element VC31, and the inductor SL32 are connected in parallel with each other between the first input/output terminal $P_{RF1}$ and the second input/output terminal $P_{RF2}$.

A transmission line which connects the switch element SW32 and the variable capacitance element VC31 is connected to ground by each of the inductor SL31 and the variable capacitance element VC32. That is, the transmission line which connects the switch element SW32 and the variable capacitance element VC31 is connected to ground by a parallel circuit of the inductor SL31 and the variable capacitance element VC32.

A transmission line which connects the variable capacitance element VC31 and the inductor SL32 is connected to ground by the inductor SL33.

With the above-described circuit configuration, as well as the radio-frequency circuits 10 and 20 of the first and second preferred embodiments, the radio-frequency circuit 30 achieves impedance matching with high precision in a wide range. The radio-frequency circuit 30 also performs ON/OFF control of the switch elements SW31 and SW32 so as to make further modifications to the circuit. This achieves impedance matching in a wider range, as in the radio-frequency circuit 20 of the second preferred embodiment.

Figure 10:
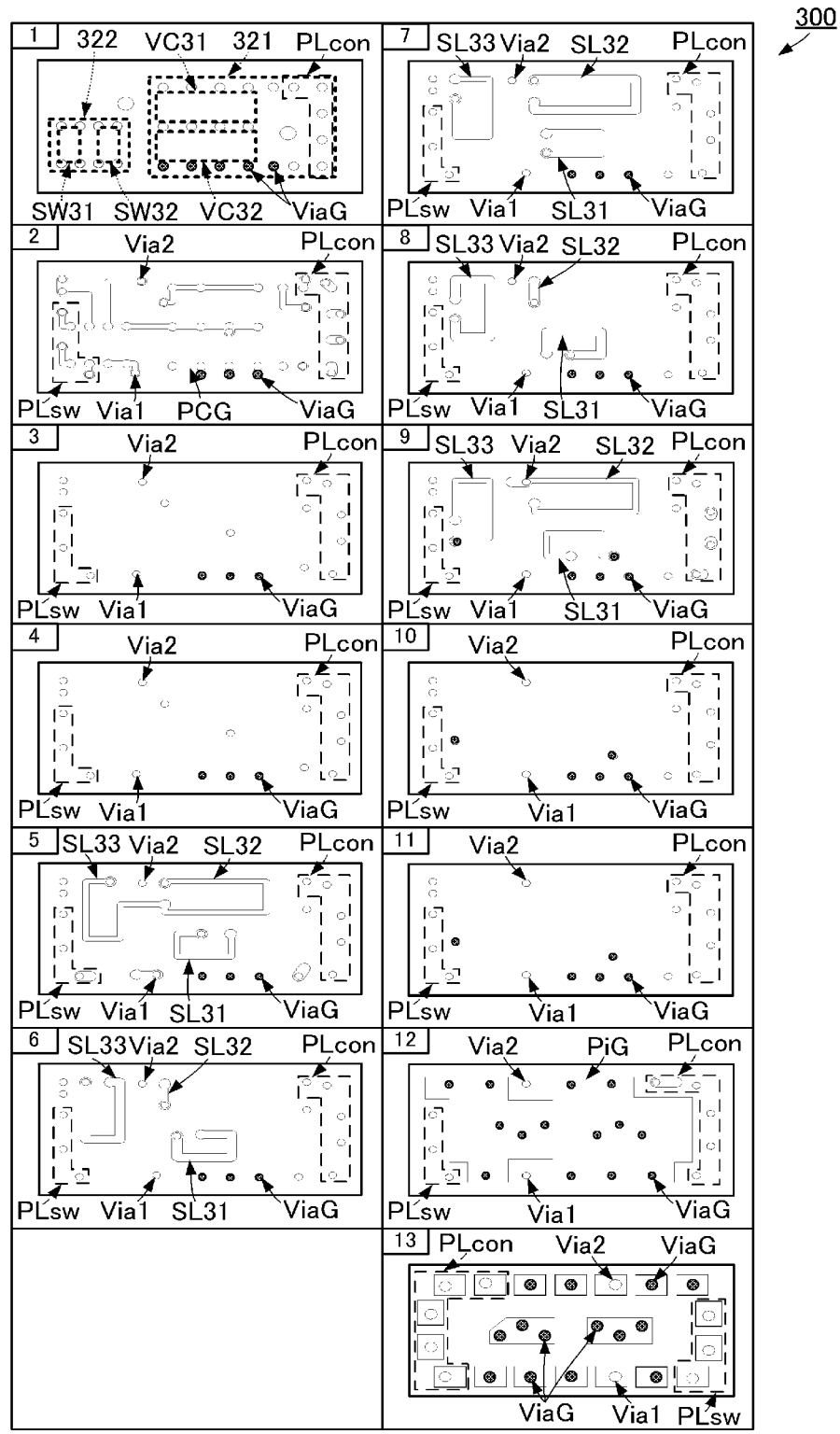
FIG. 10 is a diagram illustrating conductor patterns disposed in dielectric layers defining the radio-frequency circuit module according to the third preferred embodiment of the present invention.
Figure 11:
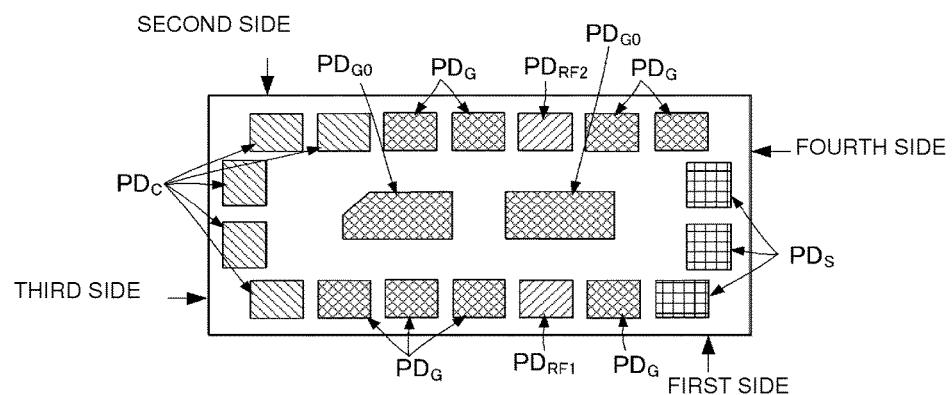
FIG. 11 is a diagram illustrating the arrangement pattern of terminals on the bottom surface of the radio-frequency circuit module according to the third preferred embodiment of the present invention.

FIG. 10 is a diagram illustrating conductor patterns disposed in dielectric layers forming the radio-frequency circuit module according to the third preferred embodiment of the present invention. The circles shown in FIG. 10 indicate via-conductors extending in a direction in which the dielectric layers are stacked. In FIG. 10, layer 13 is mirror-reversed with respect to layer 1 through layer 12. FIG. 11 is a diagram illustrating the arrangement pattern of terminals on the bottom surface of the radio-frequency circuit module according to the third preferred embodiment of the present invention.

The radio-frequency circuit 30 including the above-described circuit is implemented as a radio-frequency circuit module 300 including a multilayer body and surface-mount components 321 and 322. The basic structure of the radio-frequency circuit module 300 is preferably the same or substantially the same as that of the radio-frequency circuit module 200 of the second preferred embodiment, and the conductor patterns within the multilayer body is different from those of the radio-frequency circuit module 200.

The surface-mount component 321 has the variable capacitance elements VC31 and VC32 integrated therein, and is implemented by, for example, a semiconductor IC including varactor diodes or a semiconductor IC using MEMS (Micro Electro Mechanical Systems), BST ((Ba, Sr)TiO$_3$), and CMOS technologies. In the surface-mount component 321, the variable capacitance elements VC31 and VC32 are integrally configured within a single package, but they may be packaged individually.

The surface-mount component 322 has the switch elements SW31 and SW32 integrated therein, and is implemented by, for example, semiconductor switches. In the surface-mount component 322, the switch elements SW31 and SW32 are integrally configured within a single package, but they may be packaged individually.

The multilayer body preferably has a rectangular or substantially rectangular parallelepiped shape and is formed preferably by stacking a plurality of dielectric layers and by sintering them. As shown in FIG. 10, the multilayer body of this preferred embodiment preferably includes thirteen layers, for example. On and in each dielectric layer, as shown in FIG. 10, conductor patterns and via-conductors are provided, and various terminals to be connected to an external circuit are located on the bottom surface of the multilayer body. These conductor patterns, via-conductors, and terminals define portions of the radio-frequency circuit 30 shown in FIG. 9 other than the variable capacitance elements VC31 and VC32 and the switch elements SW31 and SW32.

The mounting region of the surface-mount components 321 and 322 is preferably the same size or substantially the same size as that of the multilayer body, as viewed from above. This makes it possible to implement the smallest possible radio-frequency circuit module 300.

The more specific configuration of the multilayer body will be discussed below with reference to FIGS. 10 and 11. A description will be given below, assuming that the topmost dielectric layer of the multilayer body is layer 1, the layer number increases as the layer is located farther downward, and the bottommost dielectric layer is layer 13. For the sake of better understanding of the connection of the conductor patterns formed in the layers, the dielectric layers will be sequentially explained by starting from layer 13, that is, the bottommost layer.

On the back surface of layer 13 (back surface of the multilayer body), as shown in FIG. 11, terminals to be connected to an external circuit are formed and arranged. The terminals include control terminals $PD_C$, a plurality of transmission terminals, and switching terminals $PD_S$. The transmission terminals include a first external connection terminal $PD_{RF1}$, a second external connection terminal $PD_{RF2}$, a plurality of ground connection terminals $PD_G$, and base ground connection terminals $PD_{G0}$. The control terminals $PD_C$ are terminals configured to supply a drive signal and a control signal to the variable capacitance elements VC31 and VC32. The switching terminals $PD_S$ are terminals configured to supply a drive signal and a control signal to the switch elements SW31 and SW32.

The first external connection terminal $PD_{RF1}$, the second external connection terminal $PD_{RF2}$, the plurality of ground connection terminals $PD_G$, the plurality of control terminals $PD_C$, and the plurality of switching terminals $PD_S$ are formed and arranged along the four sides of the back surface.

The first external connection terminal $PD_{RF1}$ is disposed near the first side of the back surface at a position separate from both ends of the first side (end portions interesting with the third and fourth sides). At both sides of the first external connection terminal $PD_{RF1}$ disposed along the first side, the ground connection terminals $PD_G$ are disposed.

The second external connection terminal $PD_{RF2}$ is disposed near the second side of the back surface opposing the first side at a position separate from both ends of the second side (end portions interesting with the third and fourth sides). At both sides of the second external connection terminal $PD_{RF2}$ disposed along the second side, the ground connection terminals $PD_G$ are disposed.

The plurality of control terminals $PD_C$ are disposed along the third or second side in a region including the third side and a predetermined range of the second side at a position close to the third side. That is, a control area PLcon in which the plurality of control terminals $PD_C$ are disposed is set near the third side when the multilayer body 110 is viewed from above. The control area PLcon is an area along the third side and the second side and having a predetermined width. With this arrangement, the control area PLcon is separated from a transmission area in which the transmission terminals are formed.

The plurality of switching terminals $PD_S$ are disposed near and along the fourth side opposing the third side. That is, a switch control area PLsw in which the plurality of switching terminals $PD_S$ are disposed is set near the fourth side when the multilayer body 110 is viewed from above. The control switch area PLsw is an area along the fourth side and having a predetermined width. With this arrangement, the switch control area PLsw is separated from the control area PLcon and the transmission area in which the transmission terminals are located.

The base ground connection terminals $PD_{G0}$ are disposed at the central region surrounded by the peripheries where the above-described terminals are disposed. The base ground connection terminals $PD_{G0}$ preferably have a larger configuration than the above-described terminals.

With this configuration, terminals connected to ground (ground connection terminals $PD_G$ and base ground connection terminals $PD_{G0}$) are disposed between the first external connection terminal $PD_{RF1}$ and the plurality of control terminals $PD_C$. This makes it possible to secure high isolation between the first external connection terminal $PD_{RF1}$ and the control terminals $PD_C$, thus reducing the possibility that a control signal mix with a radio-frequency signal to be transmitted.

Terminals connected to ground (ground connection terminals $PD_G$ and base ground connection terminals $PD_{G0}$) are disposed between the second external connection terminal $PD_{RF2}$ and the plurality of control terminals $PD_C$. This makes it possible to secure high isolation between the second external connection terminal $PD_{RF2}$ and the control terminals $PD_C$, thus reducing the possibility that a control signal interfere with a radio-frequency signal to be transmitted.

That is, it is possible to secure high isolation between the transmission terminals and the control terminals $PD_C$.

In this configuration, terminals connected to ground (ground connection terminal $PD_G$ and base ground connection terminal $PD_{G0}$) are disposed between the first external connection terminal $PD_{RF1}$ and the plurality of switching terminals $PD_S$. This makes it possible to secure high isolation between the first external connection terminal $PD_{RF1}$ and the switching terminals $PD_S$, thus reducing the possibility that a switch control signal mix with a radio-frequency signal to be transmitted.

Terminals connected to ground (ground connection terminals $PD_G$ and base ground connection terminal $PD_{G0}$) are disposed between the second external connection terminal $PD_{RF2}$ and the plurality of switching terminals $PD_S$. This makes it possible to secure high isolation between the second external connection terminal $PD_{RF2}$ and the switching terminals $PD_S$, thus reducing the possibility that a switch control signal interfere with a radio-frequency signal to be transmitted.

That is, it is possible to secure high isolation between the transmission terminals and the switching terminals $PD_S$.

The first external connection terminal $PD_{RF1}$ and the second external connection terminal $PD_{RF2}$ are respectively disposed near the first side and the second side opposing each other. Accordingly, there is a great distance between the first external connection terminal $PD_{RF1}$ and the second external connection terminal $PD_{RF2}$, thus making it possible to secure high isolation between the first external connection terminal $PD_{RF1}$ and the second external connection terminal $PD_{RF2}$. Additionally, the base ground connection terminals $PD_{G0}$ are disposed between the first external connection terminal $PD_{RF1}$ and the second external connection terminal $PD_{RF2}$, thus making it possible to secure even higher isolation between the first external connection terminal $PD_{RF1}$ and the second external connection terminal $PD_{RF2}$.

In layer 13, a plurality of via-conductors are formed. The via-conductors include a first RF via-conductor Via1, a second RF via-conductor Via2, a plurality of ground via-conductors ViaG, a plurality of control via-conductors, and a plurality of switching via-conductors. The first RF via-conductor Via1 and the second RF via-conductor Via2 are connected to the first external connection terminal $PD_{RF1}$ and the second external connection terminal $PD_{RF2}$, respectively. The plurality of ground via-conductors ViaG are each connected to one of the plurality of ground connection terminals $PD_G$ and base ground connection terminals $PD_{G0}$. The plurality of control via-conductors are connected to the plurality of respective control terminals $PD_C$. The plurality of switching via-conductors are connected to the plurality of respective switching terminals $PD_S$.

On and in layer 12, an internal ground conductor PiG and a plurality of via-conductors are provided. The plurality of via-conductors in layer 12 are formed continuously from those formed in layer 13 in the stacking direction.

The internal ground conductor PiG is a planar conductor pattern provided on substantially the entire surface, except for the control area PLcon and the switch control area PLsw, that is, it is provided on substantially the entire surface of the transmission area. The internal ground conductor PiG is connected to the plurality of ground connection terminals $PD_G$ and the base ground connection terminals $PD_{G0}$ through the use of a plurality of ground via-conductors ViaG. The internal ground conductor PiG is configured such that it is not located at positions at which a first RF via-conductor Via1 and a second RF via-conductor Via2 are formed. The internal ground conductor PiG is also configured such that it is not located in regions where the first and second external connection terminals $PD_{RF1}$ and $PD_{RF2}$ in layer 13 are formed, as viewed from above.

With this configuration, the first RF via-conductor Via1 is surrounded by the first side and the internal ground conductor PiG, while the second RF via-conductor Via2 is surrounded by the second side and the internal ground conductor PiG. With this arrangement, in layer 12, too, it is possible to secure high isolation between the first RF via-conductor Via1 and the second RF via-conductor Via2 and between the first and second RF via-conductors Via1 and Via2 and the control via-conductors. Moreover, since the first and second external connection terminals $PD_{RF1}$ and $PD_{RF2}$ do not oppose the internal ground conductor PiG, it is also possible to reduce radio-frequency coupling between the first external connection terminal $PD_{RF1}$ and the second external connection terminal $PD_{RF2}$ via the internal ground conductor PiG.

With this configuration, in layer 12, too, the control area PLcon, the transmission area, and the switch control area PLsw are separated from each other.

In layer 11, a plurality of via-conductors are formed. The plurality of control via-conductors and switching via-conductors in layer 11 are formed continuously from those formed in layer 12 in the stacking direction. First and second RF via-conductors Via1 and Via2 in layer 11 are formed continuously from those formed in layer 12 in the stacking direction.

When the multilayer body is viewed from above, a plurality of ground via-conductors ViaG in layer 11 are located within a region where the internal ground conductor PiG in layer 12 is formed, and are connected to the internal ground conductor PiG in layer 12. Some of the plurality of ground via-conductors ViaG are located near and along the first side, and are disposed between the first RF via-conductor Via1 and the control via-conductors. Since these ground via-conductors ViaG are located within the region in which the internal ground conductor PiG is formed, they are located within the transmission area.

With this configuration, in layer 11, too, the control area PLcon, the transmission area, and the switch control area PLsw are separated from each other.

In layer 10, a plurality of via-conductors are formed. The plurality of via-conductors in layer 10 are formed continuously from those formed in layer 11 in the stacking direction.

With this configuration, in layer 10, too, the control area PLcon, the transmission area, and the switch control area PLsw are separated from each other.

In layer 9, a plurality of via-conductors are formed. The plurality of via-conductors in layer 9 are formed continuously from those formed in layer 10 in the stacking direction.

On layer 9, a loop-shaped linear conductor defining the inductor SL31, a loop-shaped linear conductor defining the inductor SL32, and a loop-shaped linear conductor defining the inductor SL33 are provided. The loop-shaped linear conductors defining the inductors SL31, SL32, and SL33 are formed within the transmission area.

With this configuration, in layer 9, too, the control area PLcon, the transmission area, and the switch control area PLsw are separated from each other.

One end of the loop-shaped linear conductor defining the inductor SL31 and one end of the loop-shaped linear conductor defining the inductor SL33 are connected to ground via-conductors ViaG. One end of the loop-shaped linear conductor defining the inductor SL32 is connected to a second RF via-conductor Via2.

In layer 8, a plurality of via-conductors are formed. The plurality of via-conductors in layer 8 are formed continuously from those formed in layer 9 in the stacking direction, except for the ground via-conductors ViaG connected to the loop-shaped linear conductors defining the inductors SL31 and SL33 in layer 9.

On layer 8, loop-shaped linear conductors defining the inductors SL31 and SL33 and a linear conductor defining the inductor SL32 are provided. The loop-shaped linear conductors defining the inductors SL31 and SL33 and the linear conductor defining the inductor SL32 are located within the transmission area.

With this configuration, in layer 8, too, the control area PLcon, the transmission area, and the switch control area PLsw are separated from each other.

One end of the loop-shaped linear conductor defining the inductor SL31, one end of the loop-shaped linear conductor defining the inductor SL33, and one end of the linear conductor defining the inductor SL32 are connected to the loop-shaped linear conductors defining the inductors SL31, SL32, and SL33 in layer 9 through the via-conductors.

In Layer 7, a Plurality of Via-Conductors are Formed. The plurality of via-conductors in layer 7 are formed continuously from those formed in layer 8 in the stacking direction, except for the via-conductor connected to one end of the loop-shaped linear conductor defining the inductor SL31, the via-conductor connected to one end of the loop-shaped linear conductor defining the inductor SL33, and the via-conductor connected to one end of the loop-shaped linear conductor defining the inductor SL32 in layer 8.

On layer 7, loop-shaped linear conductors defining the inductors SL31, SL32, and SL33 are provided. The loop-shaped linear conductors defining the inductors SL31, SL32, and SL33 are located within the transmission area.

With this configuration, in layer 7, too, the control area PLcon, the transmission area, and the switch control area PLsw are separated from each other.

One end of the loop-shaped linear conductor defining the inductor SL31, one end of the loop-shaped linear conductor defining the inductor SL32, and one end of the loop-shaped linear conductor defining the inductor SL33 are connected to the loop-shaped linear conductors defining the inductors SL31 and SL33 and the linear conductor defining the inductor SL32 in layer 8 through the via-conductors.

In layer 6, a plurality of via-conductors are formed. The plurality of via-conductors in layer 6 are formed continuously from those formed in layer 7 in the stacking direction, except for the via-conductor connected to one end of the loop-shaped linear conductor defining the inductor SL31, the via-conductor connected to one end of the loop-shaped linear conductor defining the inductor SL32, and the via-conductor connected to one end of the loop-shaped linear conductor defining the inductor SL33 in layer 7.

On layer 6, loop-shaped linear conductors defining the inductors SL31 and SL33 and a linear conductor defining the inductor SL32 are provided. The loop-shaped linear conductors defining the inductors SL31 and SL33 and the linear conductor defining the inductor SL32 are located within the transmission area.

With this configuration, in layer 6, too, the control area PLcon, the transmission area, and the switch control area PLsw are separated from each other.

One end of the loop-shaped linear conductor defining the inductor SL31, one end of the loop-shaped linear conductor defining the inductor SL33, and one end of the linear conductor defining the inductor SL32 are connected to the loop-shaped linear conductors defining the inductors SL31, SL32, and SL33 in layer 7 through the via-conductors.

In layer 5, a plurality of via-conductors are formed. The plurality of via-conductors in layer 5 are formed continuously from those formed in layer 6 in the stacking direction, except for the via-conductor connected to one end of the loop-shaped linear conductor defining the inductor SL31 and the via-conductor connected to one end of the loop-shaped linear conductor defining the inductor SL33 in layer 6.

On layer 5, loop-shaped linear conductors defining the inductors SL31, SL32, and SL33 are provided. The loop-shaped linear conductors defining the inductors SL31, SL32, and SL33 are formed within the transmission area.

With this configuration, in layer 5, too, the control area PLcon, the transmission area, and the switch control area PLsw are separated from each other.

One end of the loop-shaped linear conductor defining the inductor SL31, one end of the loop-shaped linear conductor defining the inductor SL32, and one end of the loop-shaped linear conductor defining the inductor SL33 are connected to the loop-shaped linear conductors defining the inductors SL31 and SL33 and the linear conductor defining the inductor SL32 in layer 6 through the via-conductors.

The other end of the loop-shaped linear conductor defining the inductor SL31 is connected to the switch element SW32 of the surface-mount component 322 through the via-conductors of layer 4, layer 3, layer 2, and layer 1. The other ends of the loop-shaped linear conductors defining the inductors SL32 and SL33 are connected to each other.

In layer 4, a plurality of via-conductors are formed. The plurality of via-conductors in layer 4 are formed continuously from those formed in layer 5 in the stacking direction, except for the via-conductor connected to one end of the loop-shaped linear conductor defining the inductor SL31, the via-conductor connected to one end of the loop-shaped linear conductor defining the inductor SL32, and the via-conductor connected to one end of the loop-shaped linear conductor defining the inductor SL33 in layer 5.

On layer 4, routing conductors for finely adjusting the position of the first RF via-conductor Via1 are provided. These routing conductors are located within the transmission area.

With this configuration, in layer 4, too, the control area PLcon, the transmission area, and the switch control area PLsw are separated from each other.

In layer 3, a plurality of via-conductors are formed. The plurality of via-conductors in layer 3 are formed continuously from those formed in layer 4 in the stacking direction.

With this configuration, in layer 3, too, the control area PLcon, the transmission area, and the switch control area PLsw are separated from each other.

In layer 2, a plurality of via-conductors are formed. The plurality of via-conductors in layer 2 are formed continuously from those formed in layer 3 in the stacking direction, except for the ground via-conductors ViaG in layer 3. In layer 2, a plurality of ground via-conductors ViaG are formed at positions at which they are superposed on a ground connection conductor PCG, which will be described.

On layer 2, the ground connection conductor PCG is provided. The ground connection conductor PCG includes a linear conductor which connects a plurality of ground via-conductors ViaG adjacent to the ground connection conductor PCG. The ground connection conductor PCG stabilizes the ground potential of the plurality of ground via-conductors ViaG. The ground connection conductor PCG is located within the transmission area.

On layer 2, various routing conductors are provided. These routing conductors are located within the transmission area.

With this configuration, in layer 2, too, the control area PLcon, the transmission area, and the switch control area PLsw are separated from each other.

In layer 1, a plurality of via-conductors are formed. The plurality of via-conductors in layer 1 are formed continuously in the stacking direction from the via-conductors and the RF via-conductors Via1 and Via2 formed in layer 2, except for the ground via-conductors ViaG, directly or via the routing conductors. In layer 1, a plurality of ground via-conductors ViaG are formed at positions at which they are superposed on the ground connection conductor PCG in layer 2.

On the front surface of layer 1 (front surface of the multilayer body), mounting lands configured to mount the surface-mount components 321 and 322 are formed. In FIG. 10, the via-conductors formed in layer 1 are shown, and the mounting lands are also located at the positions at which these via-conductors are disposed.

The mounting lands on which control terminals for the variable capacitance elements VC31 and VC32 of the surface-mount component 321 will be mounted are connected to the control terminals $PD_C$ formed on the back surface of the multilayer body through the via-conductors in the above-described control area PLcon.

The mounting lands on which control terminals for the switch elements SW31 and SW32 of the surface-mount component 322 will be mounted are connected to the switching terminals Pips formed on the back surface of the multilayer body through the via-conductors in the above-described switch control area PLsw.

Some of the mounting lands on which signal transmission terminals for the variable capacitance elements VC31 and VC32 and the switch elements SW31 and SW32 will be mounted are connected to the above-described ground via-conductors ViaG. As stated above, in the configuration of this preferred embodiment, the plurality of ground via-conductors ViaG connected to the internal ground conductor PiG disposed near the bottommost layer of the multilayer body and extending in the stacking direction are connected to each other in a direction perpendicular or substantially perpendicular to the extending direction by the ground connection conductor PCG within the layer (layer 2) near the front surface of the multilayer body. With this arrangement, the ground within the multilayer body is stabilized and strengthened, and also, the ground near the mounting positions of the surface-mount components (near the front surface of the multilayer body) is stabilized and strengthened. Additionally, a planar ground parallel or substantially parallel with the stacking direction can be formed. In the configuration of this preferred embodiment, this planar ground electrode is disposed near the side surface of the multilayer body, thus reducing electromagnetic coupling between the circuit within the multilayer body 210 and an external source. It is thus possible to implement a small radio-frequency circuit module which is even more excellent in transmission characteristics.

In the configuration of this preferred embodiment, the mounting lands to be connected to the ground of the surface-mount components 321 and 322 are connected, only through the use of the ground via-conductors ViaG and the short ground connection conductor PCG at positions at which the ground via-conductors ViaG are concentrated, to the internal ground conductor PiG disposed near the bottommost layer of the multilayer body 210 and to the ground connection terminals $PD_G$ and the base ground connection terminals $PD_{GO}$ on the back surface of the multilayer body 210. With this arrangement, the lengths of transmission lines that connect the surface-mount components 321 and 322 to the ground are decreased. Accordingly, it is possible to prevent electromagnetic coupling with other transmission lines and circuit elements and also to stabilize the ground. Thus, variable impedance characteristics with even higher precision are obtained.

In the configuration of this preferred embodiment, the second input/output terminal $P_{RF2}$ (second external connection terminal $PD_{RF2}$) and the inductor SL32 are connected to each other only through the use of via-conductors. This makes it possible to reduce electromagnetic coupling with other circuit elements or transmission lines. It is thus possible to implement a small radio-frequency circuit module which is even more excellent in variable impedance characteristics and transmission characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency circuit module comprising:
   a passive element;
   a variable capacitance element;
   a first input/output terminal;
   a second input/output terminal;
   a multilayer body including a plurality of dielectric layers stacked on each other in a stacking direction;
   a control terminal on a bottom surface of the multilayer body and that is configured to supply a control signal to the variable capacitance element; and
   a control via-conductor within the multilayer body and configured to connect the control terminal to the variable capacitance element; wherein
   the passive element includes a conductor pattern disposed within the multilayer body;
   the variable capacitance element includes a surface-mount component mounted on a top surface of the multilayer body; and
   a first external connection terminal defined by the first input/output terminal, a second external connection terminal defined by the second input/output terminal, and a plurality of ground connection terminals defining a ground of a radio-frequency circuit are located on the bottom surface of the multilayer body;
   the first external connection terminal and the second external connection terminal are disposed at different sides of the bottom surface of the multilayer body other than corners of the bottom surface such that the first external connection terminal and the second external connection terminal are sandwiched between the plurality of ground connection terminals in a direction along the sides;
   the plurality of ground connection terminals are connected to the variable capacitance element by a plurality of ground via-conductors, the plurality of ground via-conductors along the stacking direction of the multilayer body for each of the plurality of ground connection terminals;
   the plurality of ground via-conductors are connected to each other by a ground internal connection conductor pattern located on a layer adjacent to a front surface of the multilayer body; and
   as viewed in the stacking direction, a control area in which the control terminal and the control via-conductor are located is disposed at a position at which the control area is displaced from the first external connection terminal, the second external connection terminal, the passive element, and a conductor pattern defining the radio-frequency circuit so as to be spatially isolated from the first external connection terminal, the second external connection terminal, the passive element, and the conductor pattern.

2. The radio-frequency circuit module according to claim 1, wherein, when the multilayer body is viewed in a direction perpendicular to the front surface, some of the plurality of ground via-conductors are disposed between the control area in which the control terminal and the control via-conductor are located and a transmission area in which the first external connection terminal, the second external connection terminal, and the passive element are located.

3. The radio-frequency circuit module according to claim 1, wherein the first external connection terminal is connected to each of the passive element and the variable capacitance element only through a first transmission via-conductor, the first transmission via-conductor extending along the stacking direction of the multilayer body.

4. The radio-frequency circuit module according to claim 2, wherein the first external connection terminal is connected to each of the passive element and the variable capacitance element only through a first transmission via-conductor, the first transmission via-conductor extending along the stacking direction of the multilayer body.

5. The radio-frequency circuit module according to claim 3, wherein the second external connection terminal is connected to each of the passive element and the variable capacitance element only through a second transmission via-conductor, the second transmission via-conductor being located in a configuration extending along the stacking direction of the multilayer body.

6. The radio-frequency circuit module according to claim 4, wherein the second external connection terminal is connected to each of the passive element and the variable capacitance element only through a second transmission via-conductor, the second transmission via-conductor being located in a configuration extending along the stacking direction of the multilayer body.

7. The radio-frequency circuit module according to claim 1, further comprising:
   a switch element in the radio-frequency circuit and including a surface-mount component mounted on the top surface of the multilayer body;
   a switching terminal on the bottom surface of the multilayer body and configured to supply a switch control signal to the switch element; and
   a switching via-conductor within the multilayer body and configured to connect the switching terminal to the switch element; wherein
   as viewed in the stacking direction, a switch control area in which the switching terminal and the switching via-conductor are located is disposed at a position at which the switch control area is displaced from the first external connection terminal, the second external connection terminal, the passive element, the control terminal, and the control via-conductor so as to be spatially isolated from the first external connection terminal, the second external connection terminal, the passive element, the control terminal, and the control via-conductor.

8. The radio-frequency circuit module according to claim 2, further comprising:
a switch element in the radio-frequency circuit and including a surface-mount component mounted on the top surface of the multilayer body;
a switching terminal on the bottom surface of the multilayer body and configured to supply a switch control signal to the switch element; and
a switching via-conductor within the multilayer body and configured to connect the switching terminal to the switch element; wherein
as viewed in the stacking direction, a switch control area in which the switching terminal and the switching via-conductor are located is disposed at a position at which the switch control area is displaced from the first external connection terminal, the second external connection terminal, the passive element, the control terminal, and the control via-conductor so as to be spatially isolated from the first external connection terminal, the second external connection terminal, the passive element, the control terminal, and the control via-conductor.

9. The radio-frequency circuit module according to claim 3, further comprising:
a switch element in the radio-frequency circuit and including a surface-mount component mounted on the top surface of the multilayer body;
a switching terminal on the bottom surface of the multilayer body and configured to supply a switch control signal to the switch element; and
a switching via-conductor within the multilayer body and configured to connect the switching terminal to the switch element; wherein
as viewed in the stacking direction, a switch control area in which the switching terminal and the switching via-conductor are located is disposed at a position at which the switch control area is displaced from the first external connection terminal, the second external connection terminal, the passive element, the control terminal, and the control via-conductor so as to be spatially isolated from the first external connection terminal, the second external connection terminal, the passive element, the control terminal, and the control via-conductor.

10. The radio-frequency circuit module according to claim 4, further comprising:
a switch element in the radio-frequency circuit and including a surface-mount component mounted on the top surface of the multilayer body;
a switching terminal on the bottom surface of the multilayer body and configured to supply a switch control signal to the switch element; and
a switching via-conductor within the multilayer body and configured to connect the switching terminal to the switch element; wherein
as viewed in the stacking direction, a switch control area in which the switching terminal and the switching via-conductor are located is disposed at a position at which the switch control area is displaced from the first external connection terminal, the second external connection terminal, the passive element, the control terminal, and the control via-conductor so as to be spatially isolated from the first external connection terminal, the second external connection terminal, the passive element, the control terminal, and the control via-conductor.

11. The radio-frequency circuit module according to claim 5, further comprising:
a switch element in the radio-frequency circuit and including a surface-mount component mounted on the top surface of the multilayer body;
a switching terminal on the bottom surface of the multilayer body and configured to supply a switch control signal to the switch element; and
a switching via-conductor within the multilayer body and configured to connect the switching terminal to the switch element; wherein
as viewed in the stacking direction, a switch control area in which the switching terminal and the switching via-conductor are located is disposed at a position at which the switch control area is displaced from the first external connection terminal, the second external connection terminal, the passive element, the control terminal, and the control via-conductor so as to be spatially isolated from the first external connection terminal, the second external connection terminal, the passive element, the control terminal, and the control via-conductor.

12. The radio-frequency circuit module according to claim 6, further comprising:
a switch element in the radio-frequency circuit and including a surface-mount component mounted on the top surface of the multilayer body;
a switching terminal on the bottom surface of the multilayer body and configured to supply a switch control signal to the switch element; and
a switching via-conductor within the multilayer body and configured to connect the switching terminal to the switch element; wherein
as viewed in the stacking direction, a switch control area in which the switching terminal and the switching via-conductor are located is disposed at a position at which the switch control area is displaced from the first external connection terminal, the second external connection terminal, the passive element, the control terminal, and the control via-conductor so as to be spatially isolated from the first external connection terminal, the second external connection terminal, the passive element, the control terminal, and the control via-conductor.

13. The radio-frequency circuit module according to claim 1, wherein:
the variable capacitance element includes a first variable capacitance element, a second variable capacitance element, and a third variable capacitance element;
the passive element includes a first inductor, a second inductor, and a third inductor;
the first input/output terminal and the second input/output terminal are connected to each other by a series circuit including the second inductor and the second variable capacitance element;
the series circuit of the second inductor and the second variable capacitance element at a position close to the first input/output terminal is connected to ground by each of the first inductor and the first variable capacitance element; and the series circuit including the second inductor and the second variable capacitance element at a position close to the second input/output terminal is connected to ground by each of the third inductor and the third variable capacitance element.

14. The radio-frequency circuit module according to claim 5, wherein:
the variable capacitance element includes a first variable capacitance element, a second variable capacitance element, and a third variable capacitance element;
the passive element includes a first inductor, a second inductor, and a third inductor;
the first input/output terminal and the second input/output terminal are connected to each other by a series circuit including the second inductor and the second variable capacitance element;
the series circuit of the second inductor and the second variable capacitance element at a position close to the first input/output terminal is connected to ground by each of the first inductor and the first variable capacitance element; and
the series circuit including the second inductor and the second variable capacitance element at a position close to the second input/output terminal is connected to ground by each of the third inductor and the third variable capacitance element.

15. The radio-frequency circuit module according to claim 2, wherein:
the variable capacitance element includes a first variable capacitance element, a second variable capacitance element, and a third variable capacitance element;
the passive element includes a first inductor, a second inductor, and a third inductor;
the first input/output terminal and the second input/output terminal are connected to each other by a series circuit including the second inductor and the second variable capacitance element;
the series circuit of the second inductor and the second variable capacitance element at a position close to the first input/output terminal is connected to ground by each of the first inductor and the first variable capacitance element; and
the series circuit including the second inductor and the second variable capacitance element at a position close to the second input/output terminal is connected to ground by each of the third inductor and the third variable capacitance element.

16. The radio-frequency circuit module according to claim 3, wherein:
the variable capacitance element includes a first variable capacitance element, a second variable capacitance element, and a third variable capacitance element;
the passive element includes a first inductor, a second inductor, and a third inductor;
the first input/output terminal and the second input/output terminal are connected to each other by a series circuit including the second inductor and the second variable capacitance element;
the series circuit of the second inductor and the second variable capacitance element at a position close to the first input/output terminal is connected to ground by each of the first inductor and the first variable capacitance element; and
the series circuit including the second inductor and the second variable capacitance element at a position close to the second input/output terminal is connected to ground by each of the third inductor and the third variable capacitance element.

17. The radio-frequency circuit module according to claim 4, wherein:
the variable capacitance element includes a first variable capacitance element, a second variable capacitance element, and a third variable capacitance element;
the passive element includes a first inductor, a second inductor, and a third inductor;
the first input/output terminal and the second input/output terminal are connected to each other by a series circuit including the second inductor and the second variable capacitance element;
the series circuit of the second inductor and the second variable capacitance element at a position close to the first input/output terminal is connected to ground by each of the first inductor and the first variable capacitance element; and
the series circuit including the second inductor and the second variable capacitance element at a position close to the second input/output terminal is connected to ground by each of the third inductor and the third variable capacitance element.

18. The radio-frequency circuit module according to claim 7, wherein:
the variable capacitance element includes a first variable capacitance element and a second variable capacitance element;
the passive element includes a first inductor, a second inductor, a third inductor, and a fourth inductor;
the switch element includes a first switch element and a second switch element;
the first input/output terminal and the second input/output terminal are connected to each other by a series circuit including the third inductor, the first variable capacitance element, and the fourth inductor, and are also connected to each other by the second switch element;
the series circuit of the third inductor, the first variable capacitance element, and the fourth inductor at a position close to the first input/output terminal is connected to ground by a series circuit of the second inductor and the first switch element;
the series circuit of the third inductor, the first variable capacitance element, and the fourth inductor at a position close to the second input/output terminal is connected to ground by the first inductor; and
a node between the third inductor and the first variable capacitance element is connected to ground by the second variable capacitance element.

19. The radio-frequency circuit module according to claim 7, wherein:
the variable capacitance element includes a first variable capacitance element and a second variable capacitance element;
the passive element includes a first inductor, a second inductor, and a third inductor;
the switch element includes a first switch element and a second switch element;
the first input/output terminal and the second input/output terminal are connected to each other by a series circuit including the second switch element, the first variable capacitance element, and the second inductor, and are also connected to each other by the first switch element;

a node between the second switch element and the first variable capacitance element is connected to ground by each of the first inductor and the second variable capacitance element; and a node between the first variable capacitance element and the second inductor is connected to ground by the third inductor.

* * * * *